US012230326B2

(12) United States Patent
Suda et al.

(10) Patent No.: US 12,230,326 B2
(45) Date of Patent: Feb. 18, 2025

(54) SEMICONDUCTOR MEMORY DEVICE WITH CONDUCTIVE LAYERS SEPARATED BETWEEN MEMORY BLOCKS

(71) Applicant: Kioxia Corporation, Tokyo (JP)

(72) Inventors: Keisuke Suda, Yokkaichi Mie (JP);
Ryota Suzuki, Yokkaichi Mie (JP);
Kenta Yamada, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 176 days.

(21) Appl. No.: 17/943,487

(22) Filed: Sep. 13, 2022

(65) Prior Publication Data

US 2023/0307050 A1    Sep. 28, 2023

(30) Foreign Application Priority Data

Mar. 24, 2022   (JP) ................................. 2022-048390

(51) Int. Cl.
| | |
|---|---|
| *G11C 16/06* | (2006.01) |
| *G11C 5/02* | (2006.01) |
| *G11C 16/04* | (2006.01) |
| *G11C 16/14* | (2006.01) |
| *G11C 16/26* | (2006.01) |
| *G11C 16/34* | (2006.01) |
| *H10B 41/10* | (2023.01) |
| *H10B 41/27* | (2023.01) |
| *H10B 43/10* | (2023.01) |
| *H10B 43/27* | (2023.01) |

(52) U.S. Cl.
CPC .......... *G11C 16/0483* (2013.01); *G11C 5/025* (2013.01); *G11C 16/14* (2013.01); *G11C 16/26* (2013.01); *G11C 16/3436* (2013.01); *H10B 41/10* (2023.02); *H10B 41/27* (2023.02); *H10B 43/10* (2023.02); *H10B 43/27* (2023.02)

(58) Field of Classification Search
CPC ..................................................... G11C 16/26
USPC .................................................... 365/185.21
See application file for complete search history.

(56) References Cited

U.S. PATENT DOCUMENTS

| | | |
|---|---|---|
| 11,107,802 B2 | 8/2021 | Nakaki |
| 2017/0263643 A1 | 9/2017 | Shim et al. |
| 2019/0296040 A1 | 9/2019 | Fujii et al. |
| (Continued) | | |

FOREIGN PATENT DOCUMENTS

| | | |
|---|---|---|
| JP | 2019-169510 A | 10/2019 |
| JP | 2020-145233 A | 9/2020 |

*Primary Examiner* — Hoai V Ho
(74) *Attorney, Agent, or Firm* — Foley & Lardner LLP

(57) ABSTRACT

A semiconductor memory device includes memory blocks arranged in a first direction and bit lines that are arranged in a second direction, and are arranged with the memory blocks in a third direction. The memory block includes first conductive layers arranged in the third direction, a second conductive layer disposed on a side opposite to the bit lines in the third direction with respect to the first conductive layers, semiconductor layers that extend in the third direction, are opposed to the first conductive layers, have one ends in the third direction electrically connected to the second conductive layer, and have the other ends in the third direction electrically connected to the bit lines, and electric charge accumulating films disposed between the first conductive layers and the semiconductor layers. The first conductive layers and the second conductive layer are separated between the memory blocks.

20 Claims, 29 Drawing Sheets

(56) References Cited

U.S. PATENT DOCUMENTS

| | | |
|---|---|---|
| 2020/0126903 A1 | 4/2020 | Tak et al. |
| 2022/0068850 A1* | 3/2022 | Akou .................... G11C 7/1084 |
| 2022/0238164 A1* | 7/2022 | Kato ...................... G11C 16/32 |

* cited by examiner

SEMICONDUCTOR MEMORY DEVICE WITH CONDUCTIVE LAYERS SEPARATED BETWEEN MEMORY BLOCKS

CROSS-REFERENCE TO RELATED APPLICATIONS

This application is based upon and claims the benefit of Japanese Patent Application No. 2022-048390, filed on Mar. 24, 2022, the entire contents of which are incorporated herein by reference.

FIELD

Background

Embodiments described herein relate generally to a semiconductor memory device.

Description of the Related Art

There has been known a semiconductor memory device that includes a substrate, a plurality of conductive layers arranged in a direction intersecting with a surface of the substrate, a semiconductor layer opposed to the plurality of conductive layers, and an electric charge accumulating film disposed between the conductive layers and the semiconductor layer.

DETAILED DESCRIPTION

Figure 1:
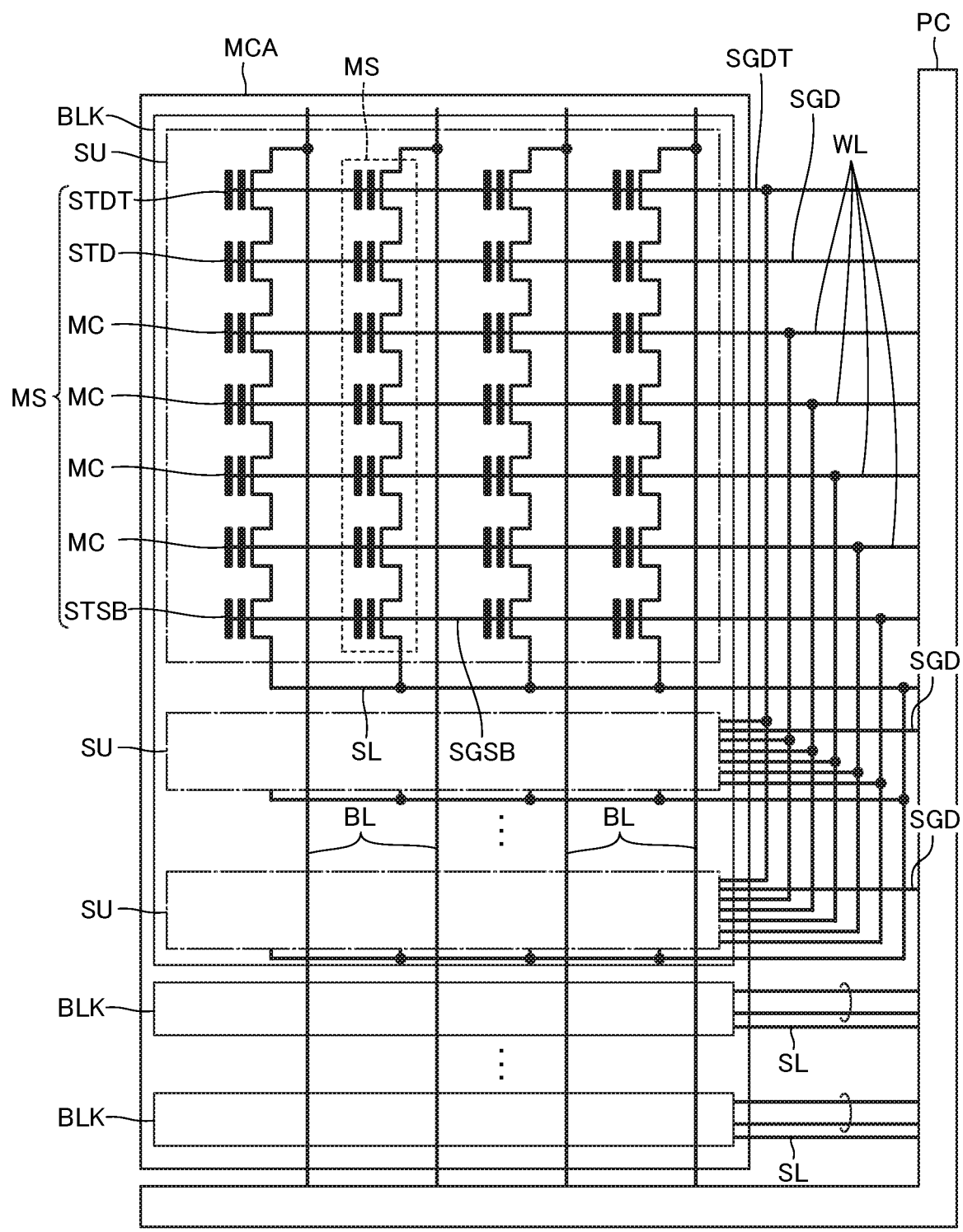
FIG. 1 is a schematic circuit diagram illustrating a configuration of a part of a semiconductor memory device according to a first embodiment.

A semiconductor memory device according to one embodiment comprises a plurality of memory blocks arranged in a first direction and a plurality of bit lines that extend in the first direction, are arranged in a second direction intersecting with the first direction, and are arranged with the plurality of memory blocks in a third direction intersecting with the first direction and the second direction. Each of the plurality of memory blocks includes a plurality of first conductive layers arranged in the third direction, a second conductive layer disposed on a side opposite to the plurality of bit lines in the third direction with respect to the plurality of first conductive layers, a plurality of semiconductor layers that extend in the third direction, are opposed to the plurality of first conductive layers, have one ends in the third direction electrically connected to the second conductive layer, and have the other ends in the third direction electrically connected to the plurality of bit lines, and a plurality of electric charge accumulating films disposed between the plurality of first conductive layers and the plurality of semiconductor layers. The plurality of first conductive layers are separated between the plurality of memory blocks. The second conductive layer is separated between the plurality of memory blocks.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

In this specification, when it is referred that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when it is referred that the first configuration "is connected between" the second configuration and a third configuration, it may mean that the first configuration, the second configuration, and the third configuration are connected in series and the second configuration is connected to the third configuration via the first configuration.

In this specification, when it is referred that a circuit or the like "electrically conducts" two wirings or the like, it may mean, for example, that this circuit or the like includes a transistor or the like, this transistor or the like is disposed in a current path between the two wirings, and this transistor or the like is turned ON.

In this specification, a direction parallel to a surface of the substrate is referred to as an X-direction, a direction parallel to the surface of the substrate and perpendicular to the X-direction is referred to as a Y-direction, and a direction perpendicular to the surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

First Embodiment

[Circuit Configuration]

FIG. 1 is a schematic circuit diagram illustrating a part of a configuration of a semiconductor memory device according to the first embodiment. As illustrated in FIG. 1, a memory die MD includes a memory cell array MCA and a peripheral circuit PC.

As illustrated in FIG. 1, the memory cell array MCA includes a plurality of memory blocks BLK. These plurality of memory blocks BLK each include a plurality of string units SU. These plurality of string units SU each include a plurality of memory strings MS. These plurality of memory strings MS have one ends each connected to the peripheral circuit PC via a bit line BL. Furthermore, these plurality of memory strings MS have the other ends each connected to the peripheral circuit PC via a common source line SL.

The memory string MS includes drain-side select transistors STDT, STD, a plurality of memory cells MC (memory transistors), and a source-side select transistor STSB. The drain-side select transistors STDT, STD, the plurality of memory cells MC, and the source-side select transistor STSB are connected in series between the bit line BL and the source line SL. Hereinafter, the drain-side select transistors STDT, STD and the source-side select transistor STSB may be simply referred to as select transistors (STDT, STD, STSB).

The memory cell MC is a field-effect type transistor. The memory cell MC includes a semiconductor layer, a gate insulating film, and a gate electrode. The semiconductor layer functions as a channel region. The gate insulating film includes an electric charge accumulating film. A threshold voltage of the memory cell MC varies corresponding to an electric charge amount in the electric charge accumulating film.

The memory cells MC each store data of 1 bit or a plurality of bits. Such memory cells MC may be referred to as data memory cells MC. In the memory string MS, one or a plurality of memory cells MC other than the data memory cells MC may be disposed between the drain-side select transistor STD and the plurality of data memory cells MC connected in series. Similarly, one or a plurality of memory cells MC other than the data memory cells MC may be disposed between the source-side select transistor STSB and the plurality of data memory cells MC connected in series. Such memory cells MC do not store data. Such memory cells MC may be referred to as dummy memory cells MC.

The gate electrodes of the plurality of memory cells MC corresponding to one memory string MS are connected to respective word lines WL. Each of these word lines WL is connected in common to all of the memory strings MS in one memory block BLK. Word lines WL connected to the data memory cells MC may be referred to as data word lines WL. Word lines WL connected to the dummy memory cells MC may be referred to as dummy word lines WL.

The select transistors (STDT, STD, STSB) are field-effect type transistors. The select transistors (STDT, STD, STSB) each include a semiconductor layer, a gate insulating film, and a gate electrode. The semiconductor layer functions as a channel region. The select gate lines (SGDT, SGD, SGSB) are connected to the respective gate electrodes of the select transistors (STDT, STD, STSB). One drain-side select gate line SGDT is connected to all of the memory strings MS in one memory block BLK in common. One drain-side select gate line SGD is connected to all of the memory strings MS in one string unit SU in common. One source-side select gate line SGSB is connected to all of the memory strings MS in one memory block BLK in common.

The respective bit lines BL are connected to all of the string units SU in the memory cell array MCA. Additionally, all of the plurality of memory strings MS included in one string unit SU are connected to different bit lines BL.

The respective source lines SL are connected to all of the memory strings MS included in one memory block BLK. All of the plurality of memory blocks BLK included in one memory cell array MCA are connected to different source lines SL.

The peripheral circuit PC includes, for example, a voltage generation circuit that generates operating voltages, a voltage transfer circuit that transfers the generated operating voltages to, for example, bit lines BL, word lines WL, source lines SL, select gate lines (SGDT, SGD, SGSB), and the like, sense amplifier modules connected to the bit lines BL, and a sequencer that controls them.

[Structure of Memory Cell Array MCA]

Figure 2:
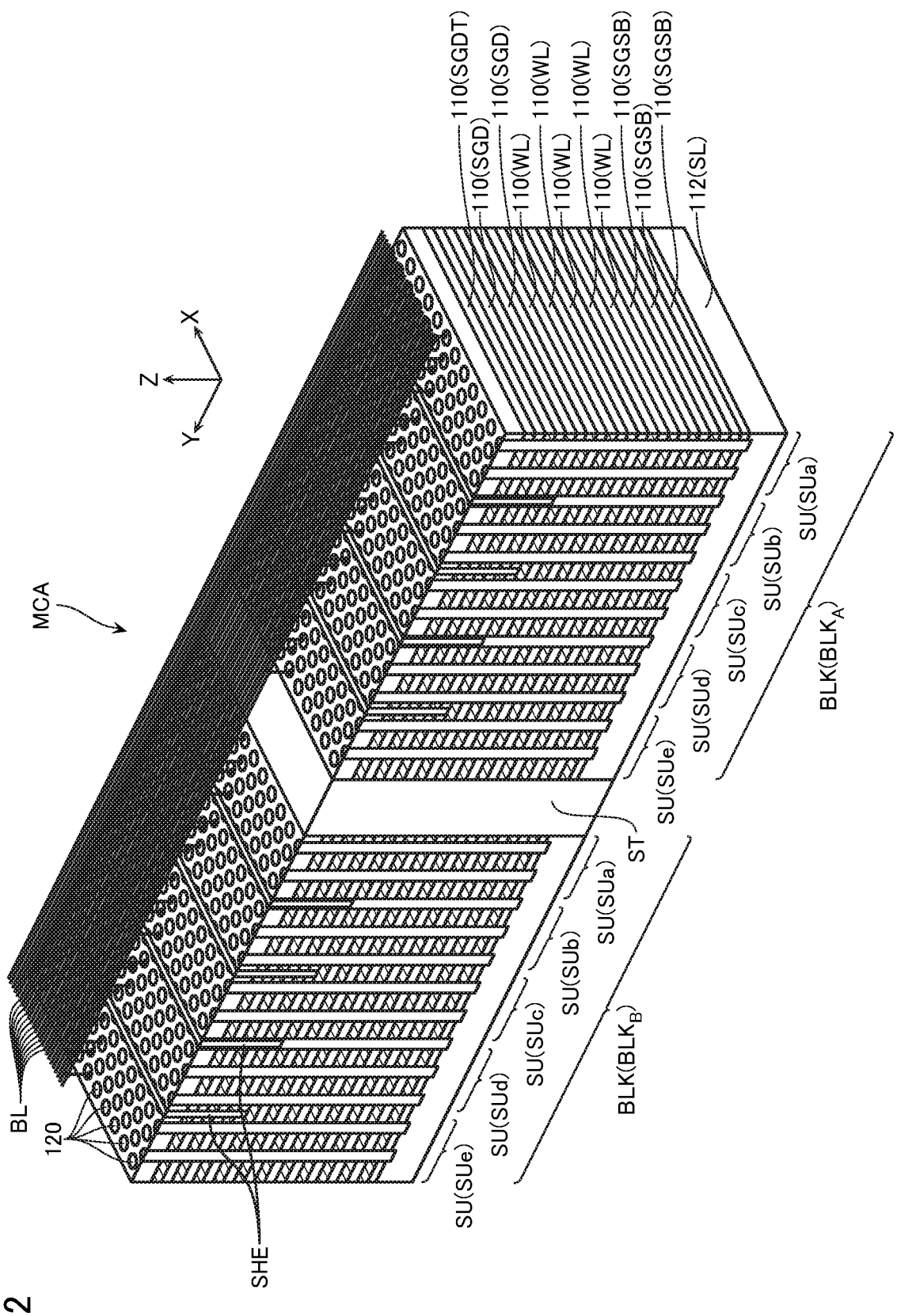
FIG. 2 is a schematic perspective view illustrating a configuration of a part of a memory cell array MCA.
Figure 3:
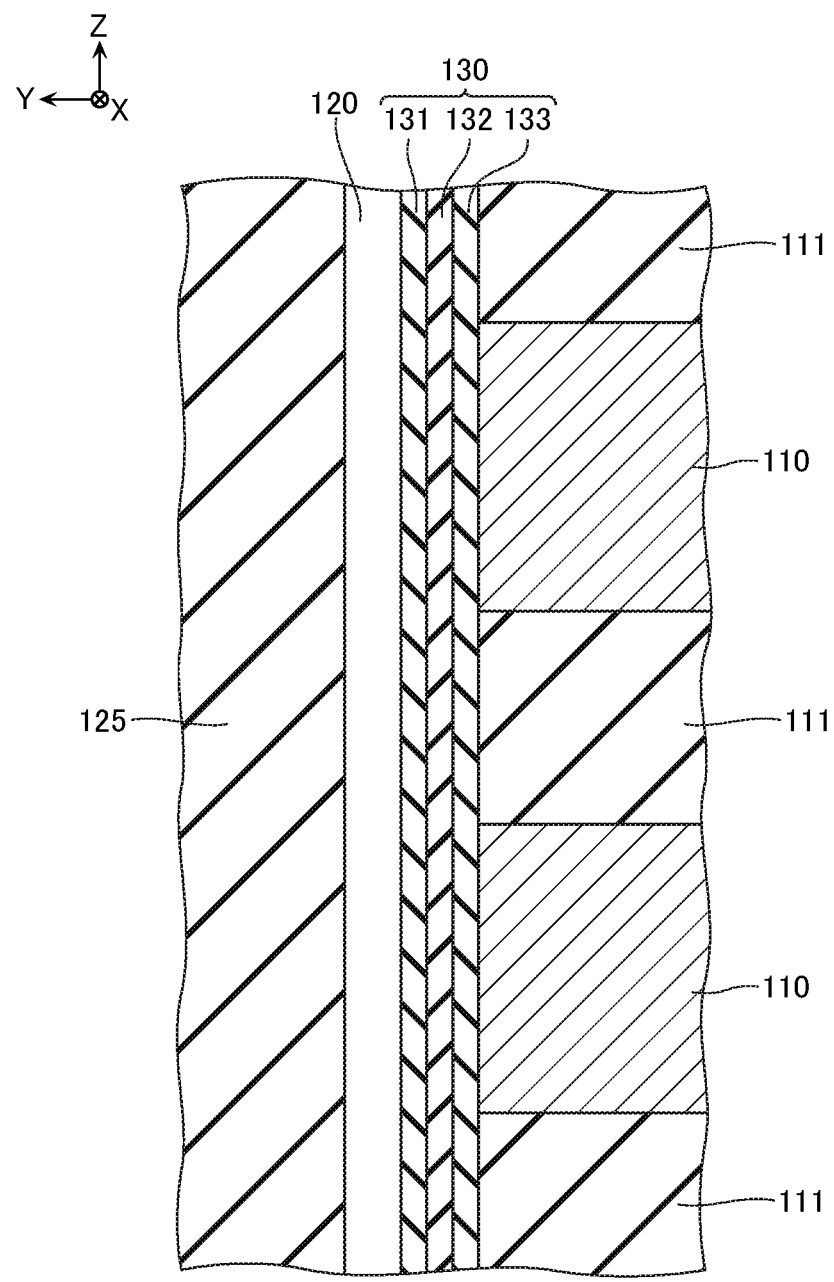
FIG. 3 is a schematic cross-sectional view illustrating a part of a configuration of the memory cell array MCA.

FIG. 2 is a schematic perspective view illustrating a configuration of a part of the memory cell array MCA. FIG. 3 is a schematic cross-sectional view illustrating a part of a configuration of the memory cell array MCA. Although FIG. 3 illustrates a Y-Z cross-sectional surface, a structure similar to FIG. 3 is also observed when a cross-sectional surface (for example, an X-Z cross-sectional surface) other than the Y-Z cross-sectional surface along the central axis of a semiconductor layer 120 is observed.

As illustrated in FIG. 2, the memory cell array MCA includes the plurality of memory blocks BLK arranged in the Y-direction. An inter-memory block insulating layer ST is disposed between two memory blocks BLK adjacent in the Y-direction. In the example of FIG. 2, the two respective memory blocks BLK adjacent in the Y-direction are denoted as memory blocks $BLK_A$, $BLK_B$.

The memory block BLK includes the plurality of string units SU arranged in the Y-direction. An inter-string unit insulating layer SHE is disposed between two string units SU adjacent in the Y-direction. In the example of FIG. 2, the five respective string units SU arranged in the Y-direction are denoted as string units SUa to SUe.

For example, as illustrated in FIG. 2, the memory block BLK includes a plurality of conductive layers 110 arranged in the Z-direction, a conductive layer 112 disposed below the plurality of conductive layers 110, and a plurality of semiconductor layers 120 extending in the Z-direction. Additionally, as illustrated in FIG. 3, between the plurality of conductive layers 110 and the plurality of semiconductor layers 120, respective gate insulating films 130 are disposed.

The conductive layer 110 has an approximately plate shape extending in the X-direction. The conductive layer 110 may include, for example, a stacked film of a barrier conductive film of titanium nitride (TiN) or the like and a metal film of tungsten (W) or the like. The conductive layer 110 may contain, for example, polycrystalline silicon containing impurities, such as phosphorus (P) or boron (B). Between the plurality of conductive layers 110 arranged in the Z-direction, insulating layers 111 (FIG. 3) of silicon oxide ($SiO_2$) or the like are disposed.

A plurality of conductive layers 110 each function as the word line WL (FIG. 1) and the gate electrodes of the plurality of memory cells MC (FIG. 1) connected to the word line WL. In the following description, such conductive layers 110 are referred to as conductive layers 110 (WL) in some cases. Among the plurality of conductive layers 110, one or more conductive layers 110 (WL) may be connected to the gate electrodes of the dummy memory cells MC. These plurality of conductive layers 110 (WL) are each electrically independent for each memory block BLK. In the example of FIG. 2, the conductive layers 110 (WL) corresponding to the two memory blocks BLK adjacent in the Y-direction are insulated via the inter-memory block insulating layer ST.

One or a plurality of conductive layers 110 positioned below the plurality of conductive layers 110 (WL) function as the source-side select gate line SGSB (FIG. 1) and gate electrodes of the plurality of source-side select transistors STSB (FIG. 1) connected to the source-side select gate line SGSB. In the following description, such conductive layer 110 is referred to as the conductive layer 110 (SGSB) in some cases. Between the plurality of conductive layers 110 (WL) and the one or the plurality of conductive layers 110 (SGSB), any other conductive layer 110 is not disposed. That is, a conductive layer 110 (WL) closest to the one or the plurality of conductive layers 110 (SGSB) among the plurality of conductive layers 110 (WL) is adjacent to the one conductive layer 110 (SGSB) or one of the plurality of conductive layers 110 (SGSB) closest to the plurality of conductive layers 110 (WL) in the Z-direction. The one or the plurality of conductive layers 110 (SGSB) are electrically independent for each memory block BLK. In the example of FIG. 2, the conductive layers 110 (SGSB) corresponding to the two memory blocks BLK adjacent in the Y-direction are insulated via the inter-memory block insulating layer ST.

One or a plurality of conductive layers 110 positioned above the plurality of conductive layers 110 (WL) function as the drain-side select gate line SGD (FIG. 1) and gate electrodes of the plurality of drain-side select transistors STD (FIG. 1) connected to the drain-side select gate line SGD. In the following description, such conductive layer 110 is referred to as the conductive layer 110 (SGD) in some cases. As illustrated in FIG. 2, a width in the Y-direction of the plurality of conductive layers 110 (SGD) is smaller than a width in the Y-direction of the conductive layers 110 (WL). Additionally, between two conductive layers 110 (SGD) adjacent in the Y-direction in one memory block BLK, the inter-string unit insulating layer SHE is disposed. These plurality of conductive layers 110 (SGD) are each electrically independent for each string unit SU. In each memory block BLK, the conductive layers 110 (SGD) corresponding to the first and fifth string units SUa, SUe counted from one side in the Y-direction (for example, the negative side in the Y-direction) are electrically insulated from the configuration in the other memory block BLK via the inter-memory block insulating layer ST disposed between the memory blocks BLK. Additionally, in each memory block BLK, the two conductive layers 110 (SGD) adjacent in the Y-direction are electrically insulated via the inter-string unit insulating layer SHE.

One or a plurality of conductive layers 110 positioned above the plurality of conductive layers 110 (SGD) function as the drain-side select gate line SGDT (FIG. 1) and gate electrodes of the plurality of drain-side select transistors STDT (FIG. 1) connected to the drain-side select gate line SGDT. In the following description, such conductive layer 110 is referred to as the conductive layer 110 (SGDT) in some cases. The conductive layer 110 (SGDT) is configured basically similar to the conductive layer 110 (SGD). However, the plurality of conductive layers 110 (SGDT) included in one memory block BLK are electrically connected to one another via a wiring or the like.

The conductive layer 112 may contain, for example, polycrystalline silicon containing N-type impurities, such as phosphorus (P). On a lower surface of the conductive layer 112, a metal, such as tungsten (W), a conductive material, such as tungsten silicide, or another conductive material may be disposed. Between the conductive layer 112 and the one or the plurality of conductive layers 110 (SGSB), any other conductive layer 110 is not disposed. That is, the conductive layer 112 is adjacent to the one conductive layer (SGSB) or another of the plurality of conductive layers 110 (SGSB) closest to the conductive layer 112 in the Z-direction.

The conductive layer 112 functions as the source line SL (FIG. 1). The conductive layer 112 are electrically independent for each memory block BLK. In the example of FIG. 2, the two conductive layers 112 corresponding to the two memory blocks BLK adjacent in the Y-direction are insulated via the inter-memory block insulating layer ST.

The semiconductor layers 120 are arranged in a predetermined pattern in the X-direction and the Y-direction. The semiconductor layers 120 each function as channel regions of the plurality of memory cells MC and the select transistors (STDT, STD, STSB) included in one memory string MS (FIG. 1). The semiconductor layer 120 contains, for example, polycrystalline silicon (Si). The semiconductor layer 120 has an approximately cylindrical shape and includes an insulating layer 125 (FIG. 3) of silicon oxide or the like at its center part. The semiconductor layers 120 have outer peripheral surfaces each surrounded by the conductive layers 110 and are opposed to the conductive layers 110.

An impurity region containing N-type impurities, such as phosphorus (P), is disposed on an upper end portion of the semiconductor layer 120. This impurity region is connected to the bit line BL via via-contact electrodes Ch, Vy (see FIG. 5). Note that all of the plurality of semiconductor layers 120 corresponding to one string unit SU are connected to different bit lines BL. In the example of FIG. 2, four rows including the plurality of semiconductor layers 120 arranged in the X-direction are arranged in the Y-direction corresponding to one string unit SU. All of the plurality of semiconductor layers 120 included in the four rows are connected to the different bit lines BL.

An impurity region containing N-type impurities, such as phosphorus (P), is disposed on a lower end portion of the semiconductor layer 120. This impurity region is connected to the conductive layer 112. Note that in the example illustrated in the drawing, all of the plurality of semiconductor layers 120 corresponding to one memory block BLK are connected to common conductive layer 112.

The gate insulating film 130 (FIG. 3) has an approximately cylindrical shape that covers the outer peripheral surface of the semiconductor layer 120. The gate insulating film 130 includes, for example, as illustrated in FIG. 3, a tunnel insulating film 131, an electric charge accumulating film 132, and a block insulating film 133, which are stacked between the semiconductor layer 120 and the conductive layers 110. The tunnel insulating film 131 and the block insulating film 133 contain, for example, silicon oxide ($SiO_2$). The electric charge accumulating film 132 contains a film, for example, silicon nitride (SiN) that can accumulate an electric charge. The tunnel insulating film 131, the electric charge accumulating film 132, and the block insulating film 133, which have approximately cylindrical shapes, extend in the Z-direction along the outer peripheral surface of the semiconductor layer 120 excluding the contact portion of the semiconductor layer 120 and the conductive layer 112.

Note that FIG. 3 illustrates an example of the gate insulating film 130 including the electric charge accumulating film 132, such as silicon nitride. However, the gate insulating film 130, for example, may include a floating gate, such as polycrystalline silicon, containing N-type or P-type impurities.

[Threshold Voltage of Memory Cell MC]

Next, with reference to FIG. 4A and FIG. 4B, the threshold voltage of the memory cell MC will be described.

Figures 4A, 4B:
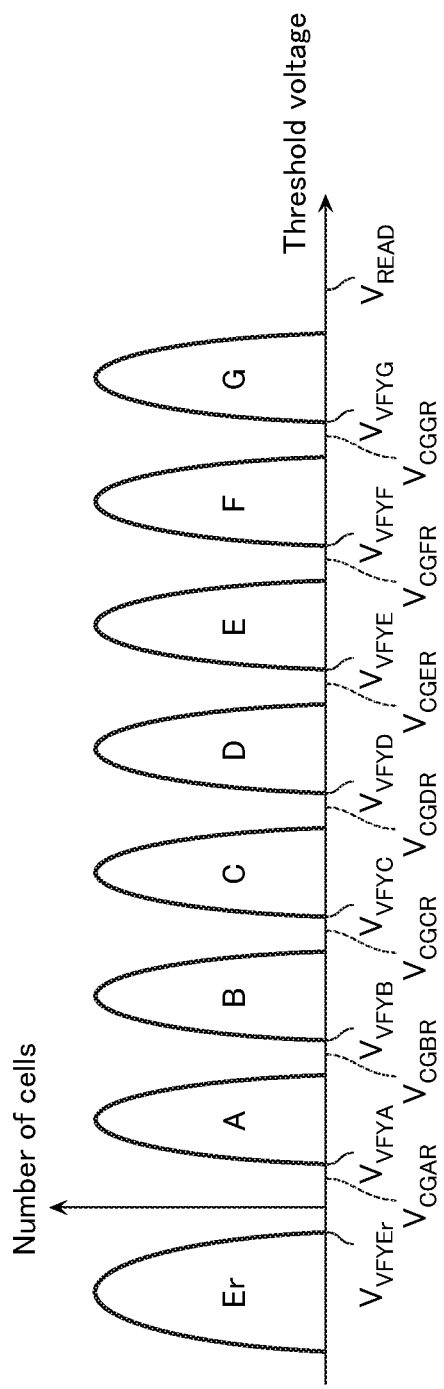
FIG. 4A is a schematic histogram for describing a threshold voltage of a memory cell MC.
FIG. 4B is a table showing an example of the relation between the threshold voltage of the memory cell MC storing three-bit data and the stored data.

FIG. 4A is a schematic histogram for describing the threshold voltage of the memory cell MC storing three-bit data. The horizontal axis indicates the voltage of the word line WL, and the vertical axis indicates the number of memory cells MC. FIG. 4B is a table showing an example of the relation between the threshold voltage of the memory cell MC storing the three-bit data and the stored data.

In the example of FIG. 4A, the threshold voltages of the memory cells MC are controlled in eight states. The threshold voltage of the memory cell MC controlled in a state Er is smaller than an erase verify voltage $V_{VFYEr}$. The threshold voltage of the memory cell MC controlled in a state A is not smaller than a verify voltage $V_{VFYA}$ and smaller than a verify voltage $V_{VFYB}$. The threshold voltage of the memory cell MC controlled in a state B is not smaller than the verify voltage $V_{VFYB}$ and smaller than a verify voltage $V_{VFYC}$. Hereinafter, similarly, the threshold voltages of the memory cells MC controlled in a state C to a state F are not smaller than the verify voltage $V_{VFYC}$ to a verify voltage $V_{VFYF}$ and smaller than a verify voltage $V_{VFYD}$ to a verify voltage $V_{VFYG}$, respectively. The threshold voltage of the memory cell MC controlled in a state G is not smaller than the verify voltage $V_{VFYG}$ and smaller than a read pass voltage $V_{READ}$.

In the example in FIG. 4A, a read voltage $V_{CGAR}$ is set between a threshold distribution corresponding to the state Er and a threshold distribution corresponding to the state A. A read voltage $V_{CGBR}$ is set between the threshold distribution corresponding to the state A and a threshold distribution corresponding to the state B. Hereinafter, similarly, a read voltage $V_{CGCR}$ to a read voltage $V_{CGGR}$ are set from a voltage between the threshold distribution corresponding to the state B and a threshold distribution corresponding to the state C to a voltage between a threshold distribution corresponding to the state F and a threshold distribution corresponding to the state G, respectively.

For example, the state Er corresponds to the lowest threshold voltage. The memory cell MC in the state Er is the memory cell MC in an erase state. For example, data "111" is assigned to the memory cell MC in the state Er.

The state A corresponds to the threshold voltage higher than the threshold voltage corresponding to the state Er. For example, data "101" is assigned to the memory cell MC in the state A.

The state B corresponds to the threshold voltage higher than the threshold voltage corresponding to the state A. For example, data "001" is assigned to the memory cell MC in the state B.

Hereinafter, similarly, the state C to the state G in the drawing correspond to threshold voltages higher than the threshold voltages corresponding to the state B to the state F. For example, data "011", "010", "110", "100", and "000" are assigned to the memory cells MC in these states.

In the case of the assignment as exemplified in FIG. 4B, the data of a lower bit is distinguishable with one read voltage $V_{CGDR}$. The data of a middle bit is distinguishable with three read voltages $V_{CGAR}$, $V_{CGCR}$, $V_{CGFR}$. The data of an upper bit is distinguishable with three read voltages $V_{CGBR}$, $V_{CGER}$, $V_{CGGR}$ This assignment of data is referred to as a 1-3-3 code in some cases.

The number of bits of the data stored in the memory cell MC, the number of states, the assignment of the data to each state, and the like are changeable as necessary.

[Read Operation]

Figure 5:
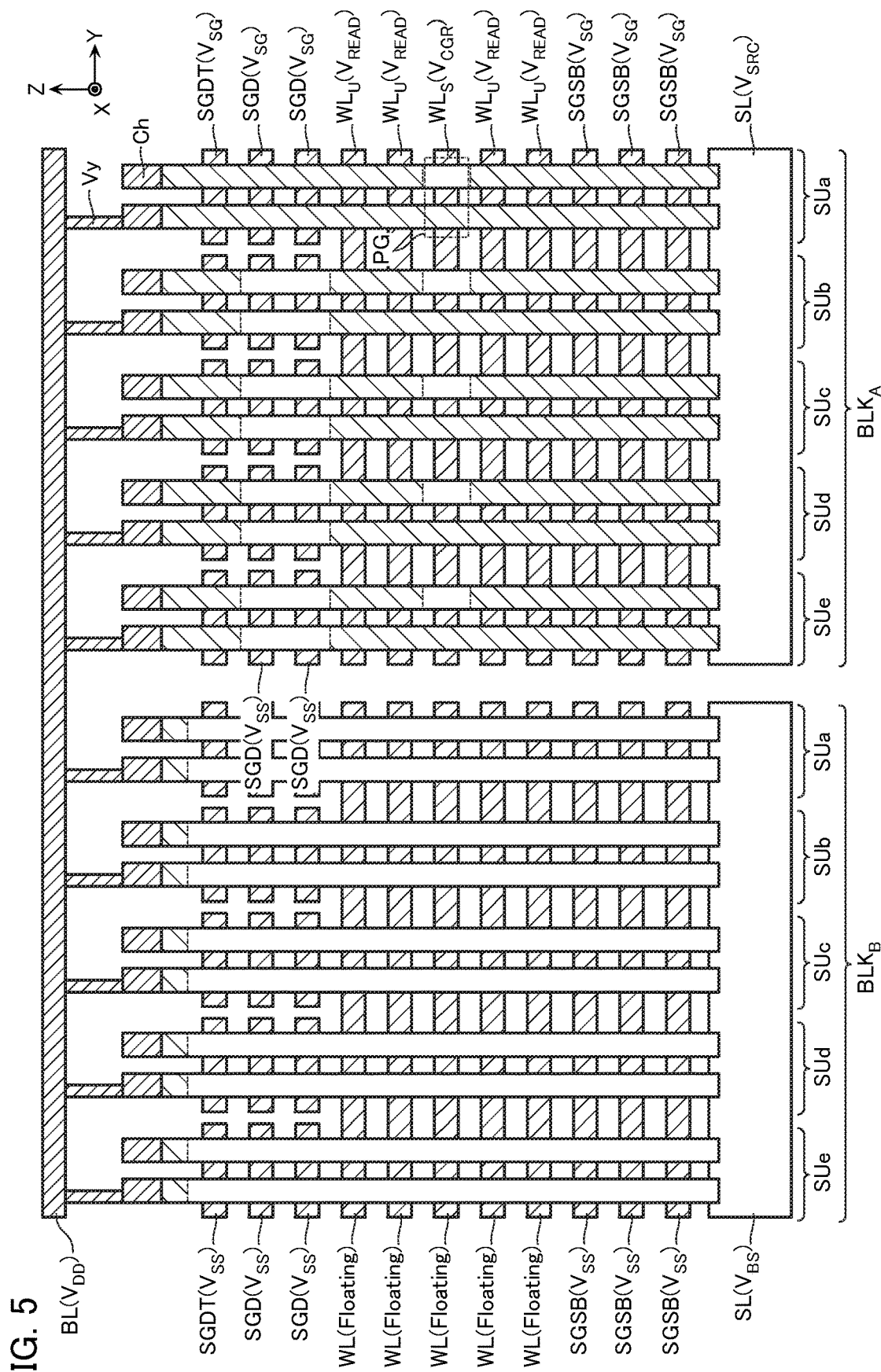
FIG. 5 is a schematic cross-sectional view for describing a read operation.

FIG. 5 is a schematic cross-sectional view for describing the read operation.

Note that, in the following description, one of the word lines WL as an operation target is referred to as a selected word line $WL_S$, and the other word lines WL are referred to as unselected word lines $WL_U$ in some cases. In the following, an example of performing the read operation on memory cells connected to the selected word line $WL_S$ (hereinafter referred to as "selected memory cells MC" and, similarly, memory cells connected to the unselected word lines $WL_U$ are referred to as "unselected memory cells MC" in some cases) among the plurality of memory cells MC included in one of the string units SU as an operation target will be described. In the following description, the configuration including such a plurality of the selected memory cells MC is referred to as a page portion PG in some cases.

Hereinafter, an example of performing the read operation on the page portion PG in the string unit SUa of a memory block $BLK_A$ will be described.

First, voltages applied to wirings in the memory block $BLK_A$ will be described.

In the read operation, for example, a voltage $V_{DD}$ is applied to the bit lines BL. Additionally, a voltage $V_{SRC}$ different from the voltage $V_{DD}$ is applied to the source line SL corresponding to the memory block $BLK_A$. The voltage $V_{SRC}$ may be larger than a ground voltage $V_{SS}$ or may be equal to the ground voltage $V_{SS}$. The voltage $V_{DD}$ is larger than the voltage $V_{SRC}$.

In the read operation, a voltage $V_{SS}$ is applied to the drain-side select gate line SGDT corresponding to the memory block $BLK_A$. The voltage $V_{SS}$ is larger than the voltage $V_{DD}$. Additionally, a voltage difference between the voltage $V_{SS}$ and the voltage $V_{DD}$ is larger than the threshold voltage of the drain-side select transistors STDT. Accordingly, electron channels are formed in the channel regions of the drain-side select transistors STDT corresponding to the memory block $BLK_A$, and the voltage $V_{DD}$ is transferred to these channel regions.

In the read operation, the voltage $V_{SG}$ is applied to the drain-side select gate line SGD corresponding to the string unit SUa in the memory block $BLK_A$. The voltage difference between the voltage $V_{SG}$ and the voltage $V_{DD}$ is larger than the threshold voltage of the drain-side select transistors STD. Accordingly, electron channels are formed in the channel regions of the drain-side select transistors STD corresponding to the string unit SUa in the memory block $BLK_A$, and the voltage $V_{DD}$ is transferred to these channel regions.

Additionally, in the read operation, to the drain-side select gate lines SGD corresponding to the string unit SUb to the string unit SUe in the memory block $BLK_A$, the ground voltage $V_{SS}$ is applied. The voltage difference between the ground voltage $V_{SS}$ and the voltage $V_{DD}$ is smaller than the threshold voltage of the drain-side select transistors STD. Therefore, electron channels are not formed in the channel regions of the drain-side select transistors STD corresponding to the string unit SUb to the string unit SUe in the memory block $BLK_A$, and the voltage $V_{DD}$ is not transferred to these channel regions.

Additionally, in the read operation, the voltage $V_{SG}$ is applied to the source-side select gate line SGSB corresponding to the memory block $BLK_A$. The voltage $V_{SG}$ is larger than the voltage $V_{SRC}$. Additionally, the voltage difference between the voltage $V_{SG}$ and the voltage $V_{SRC}$ is larger than the threshold voltage of the source-side select transistors STSB. Accordingly, electron channels are formed in the channel regions of the source-side select transistors STSB corresponding to the memory block $BLK_A$, and the voltage $V_{SRC}$ is transferred to these channel regions.

Additionally, in the read operation, the read pass voltage $V_{READ}$ is applied to the unselected word lines $WL_U$ corresponding to the memory block $BLK_A$. The read pass voltage $V_{READ}$ is larger than the voltages $V_{DD}$, $V_{SRC}$. The voltage differences between the read pass voltage $V_{READ}$ and the voltages $V_{DD}$, $V_{SRC}$ are larger than the threshold voltages of the memory cells MC regardless of the data stored in the memory cells MC. Accordingly, electron channels are formed in the channel regions of the unselected memory cells MC, and the voltages $V_{DD}$, $V_{SRC}$ are transferred to the selected memory cells MC.

Additionally, in the read operation, the read voltage $V_{CGR}$ is applied to the selected word line $WL_S$. The read voltage $V_{CGR}$ is any of the read voltages $V_{CGAR}$ to $V_{CGGR}$ described with reference to FIG. 4A. The voltage difference between the read voltage $V_{CGR}$ and the voltage $V_{SRC}$ is larger than the threshold voltages of the memory cells MC in which a certain data is stored. Therefore, selected memory cells MC in which the certain data is stored enter the ON state, and currents flow through the bit lines BL connected to these memory cells MC. On the other hand, the voltage difference between the read voltages $V_{CGR}$ and $V_{SRC}$ is smaller than the threshold voltage of the memory cell MC in which the other data is stored. Therefore, selected memory cells MC in which the other data is stored enter the OFF state, and currents do not flow through the bit lines BL connected to these memory cells MC.

In the read operation, the voltage generation circuit and the voltage transfer circuit in the peripheral circuit PC (FIG. 1) apply the voltages to each of the wirings in the memory block $BLK_A$, and the sense amplifier module in the peripheral circuit PC detects the states of each of the bit lines BL, for example, whether a current flows through the bit line BL or not. Thus, the ON state/OFF state of the selected memory cells MC connected to the selected word line $WL_S$ to which the read voltage $V_{CGR}$ is applied is detected.

Additionally, in the read operation, as necessary, arithmetic processing, such as AND and OR, is performed on the data indicative of the states of the selected memory cells MC obtained for each of the plurality of read voltages $V_{CGR}$ Accordingly, the data stored in the selected memory cell MC can be calculated.

Next, voltages applied to wirings in the memory block $BLK_B$ will be described. In the following description, voltages applied to the memory block $BLK_B$ are exemplified, but the voltages similar to the voltages applied to the memory block $BLK_B$ are also applied to the other memory blocks BLK in the memory cell array MCA.

In the read operation, the ground voltage $V_{SS}$ is applied to the drain-side select gate lines SGDT, SGD corresponding to the memory block $BLK_B$. The ground voltage $V_{SS}$ is smaller than the voltage $V_{DD}$. Additionally, the voltage difference between the ground voltage $V_{SS}$ and the voltage $V_{DD}$ is smaller than the threshold voltage of the drain-side select transistors STDT. Accordingly, electron channels are not formed in the channel regions of the drain-side select transistors STDT, STD corresponding to the memory block $BLK_B$, and the voltage $V_{DD}$ is not transferred to these channel regions.

Additionally, in the read operation, a voltage $V_{BS}$ is applied to the source line SL corresponding to the memory block $BLK_B$. The voltage $V_{BS}$ may be larger than the voltage $V_{DD}$. Note that the voltage $V_{BS}$ may be larger than the voltage $V_{SGD}$ described later with reference to FIG. 7.

Additionally, in the read operation, the ground voltage $V_{SS}$ is applied to the source-side select gate line SGSB corresponding to the memory block $BLK_B$. The ground voltage $V_{SS}$ is smaller than the voltage $V_{BS}$. The voltage difference between the ground voltage $V_{SS}$ and the voltage $V_{BS}$ is smaller than the threshold voltage of the source-side select transistors STSB. Accordingly, electron channels are not formed in the channel regions of the source-side select transistors STSB corresponding to the memory block $BLK_B$, and the voltage $V_{BS}$ is not transferred to these channel regions.

In the read operation, the word lines WL corresponding to the memory block $BLK_B$ are set to be in a floating state.

In this state, the select transistors (STDT, STD, STSB) corresponding to the memory block $BLK_B$ enter the OFF state. Accordingly, current paths between the bit lines BL and the source line SL are not formed in the memory block $BLK_B$.

[Write Operation]

Figure 6:
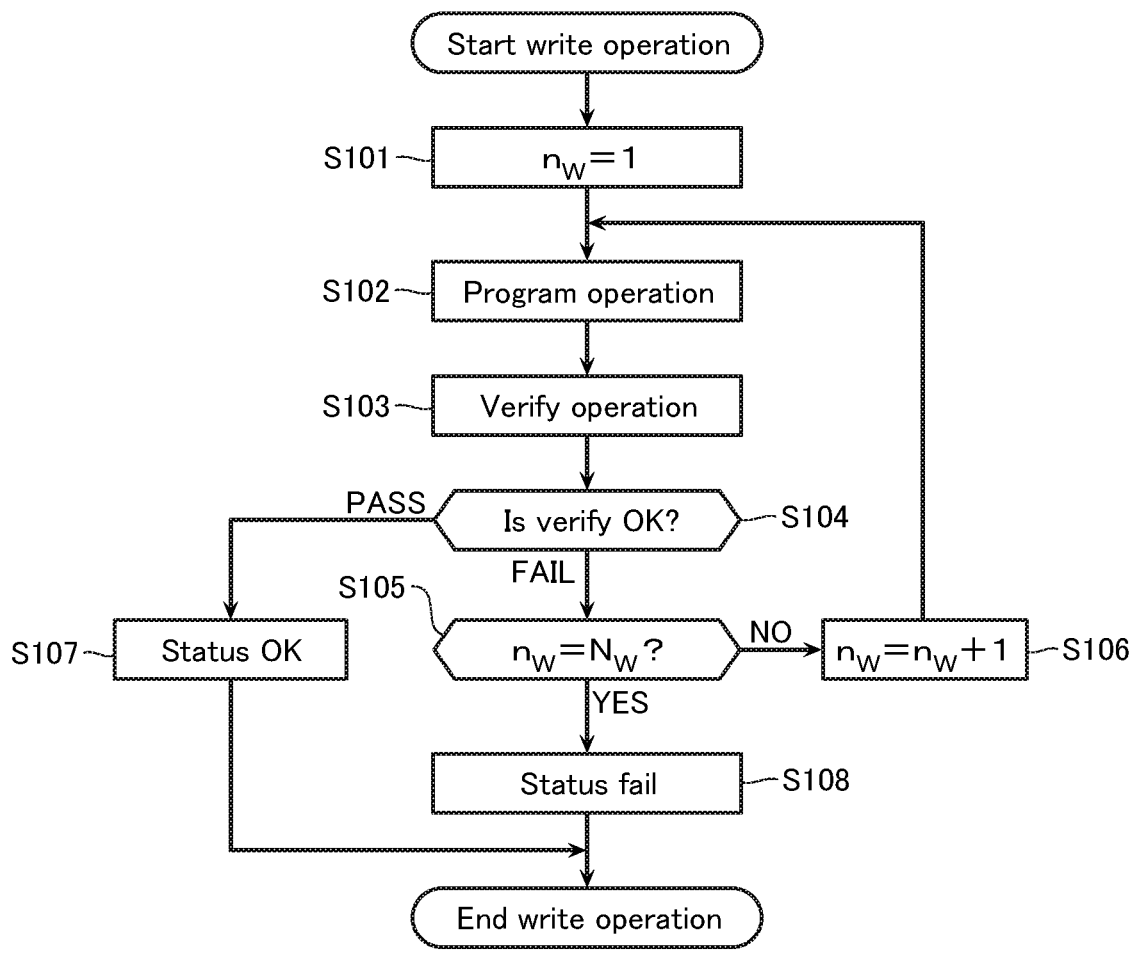
FIG. 6 is a flowchart for describing a write operation.

FIG. 6 is a flowchart for describing the write operation.

In the following description, an example of performing the write operation on the page portion PG in the string unit SUa in the memory block $BLK_A$ will be described.

At Step S101, for example, a loop count $n_W$ is set to 1. The loop count $n_W$ is a variable indicative of the count of write loop.

At Step S102, the program operation is performed. The program operation is an operation that applies a program voltage $V_{PGM}$ to the selected word line $WL_S$ to increase the threshold voltages of the selected memory cells MC.

At Step S103, a verify operation is performed. The verify operation is an operation for applying a verify voltage $V_{VFY}$ to the selected word line $WL_S$, detecting the ON state/OFF state of the selected memory cells MC, and detecting whether the threshold voltages of the selected memory cells MC have reached target values or not.

At Step S104, the result of the verify operation is determined. For example, when the number of the memory cells MC whose threshold voltages have not reached the target value is a certain number or more, it is determined to be verify FAIL and the procedure proceeds to Step S105. On the other hand, for example, when the number of the memory cells MC whose threshold voltages have not reached the target value is less than a certain number, it is determined to be verify PASS and the procedure proceeds to Step S107.

At Step S105, whether the loop count $n_W$ has reached a predetermined count $N_W$ or not is determined. When it has not reached the predetermined count $N_W$, the procedure proceeds to Step S106. When it has reached the predetermined count $N_W$, the procedure proceeds to Step S108.

At Step S106, 1 is added to the loop count $n_W$, and the procedure proceeds to Step S102. At Step S106, for example, a predetermined voltage is added to the program voltage $V_{PGM}$. Therefore, the program voltage $V_{PGM}$ increases together with the increase in the loop count $n_W$.

At Step S107, status data indicative of normal termination of the write operation is stored in a status register in the peripheral circuit PC (FIG. 1) to terminate the write operation.

At Step S108, status data indicative of failing to normally terminate the write operation is stored in the status register in the peripheral circuit PC (FIG. 1) to terminate the write operation.

Figure 7:
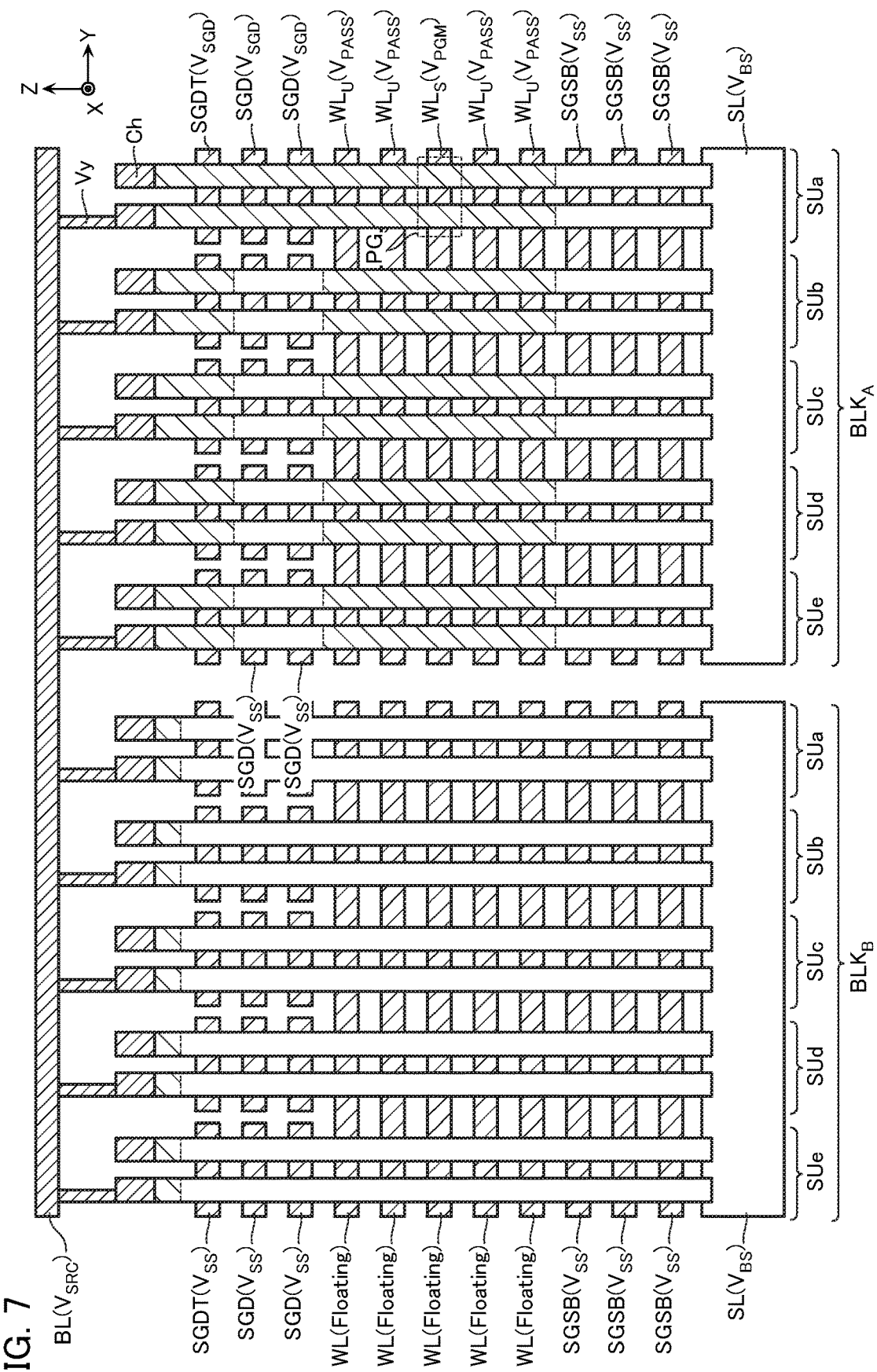
FIG. 7 is a schematic cross-sectional view for describing a program operation.

FIG. 7 is a schematic cross-sectional view for describing the program operation.

First, voltages applied to wirings in the memory block $BLK_A$ will be described.

In the program operation, for example, the voltage $V_{SRC}$ is applied to the bit lines BL connected to the selected memory cells MC on which the adjustment of the threshold voltage is performed among the plurality of selected memory cells MC. Although the illustration is omitted, the voltage $V_{DD}$ is applied to the bit lines BL connected to the selected memory cells MC on which the adjustment of the threshold voltage is not performed among the plurality of selected memory cells MC. Hereinafter, the selected memory cells MC on which the adjustment of the threshold voltage is performed among the plurality of selected memory cells MC are referred to as "write memory cells MC" and the selected memory cells MC on which the adjustment of the threshold voltage is not performed are referred to as "inhibited memory cells MC" in some cases.

Additionally, in the program operation, the voltage $V_{SGD}$ is applied to the drain-side select gate line SGDT corresponding to the memory block $BLK_A$ and the drain-side select gate line SGD corresponding to the string unit SUa in the memory block $BLK_A$.

The voltage $V_{SGD}$ is larger than the voltage $V_{SRC}$. Additionally, the voltage difference between the voltage $V_{SGD}$ and the voltage $V_{SRC}$ is larger than the threshold voltages of the drain-side select transistors STDT, STD. Therefore, electron channels are formed in the channel regions of the drain-side select transistors STDT, STD corresponding to the bit lines BL connected to the write memory cells MC, and the voltage $V_{SRC}$ is transferred to these channel regions.

On the other hand, the voltage difference between the voltage $V_{SGD}$ and the voltage $V_{DD}$ is smaller than the threshold voltages of the drain-side select transistors STDT, STD. Accordingly, the drain-side select transistors STDT, STD corresponding to the bit lines BL connected to the inhibited memory cells MC enter the OFF state.

Additionally, in the program operation, to the drain-side select gate lines SGD corresponding to the string unit SUb to the string unit SUe in the memory block $BLK_A$, the ground voltage $V_{SS}$ is applied. The voltage differences between the ground voltage $V_{SS}$ and the voltages $V_{SRC}$, $V_{DD}$ are smaller than the threshold voltage of the drain-side select transistors STD. Therefore, electron channels are not formed in the channel regions of the drain-side select transistors STD corresponding to the string unit SUb to the string unit SUe in the memory block $BLK_A$, and the voltages $V_{SRC}$, $V_{DD}$ are not transferred to these channel regions.

Additionally, in the program operation, the voltage $V_{BS}$ is applied to the source line SL corresponding to the memory block $BLK_A$, and the ground voltage $V_{SS}$ is applied to the source-side select gate line SGSB. Thus, the source-side select transistors STSB enter the OFF state.

Additionally, in the program operation, the write pass voltage $V_{PASS}$ is applied to the unselected word lines $WL_U$ corresponding to the memory block $BLK_A$. The write pass voltage $V_{PASS}$ is larger than the read pass voltage $V_{READ}$. The voltage difference between the write pass voltage $V_{PASS}$ and the voltage $V_{SRC}$ is larger than the threshold voltages of the memory cells MC regardless of the data stored in the memory cells MC. Therefore, electron channels are formed in the channel regions of the unselected memory cells MC connected to the write memory cells MC among the unselected memory cells MC corresponding to the string unit SUa in the memory block $BLK_A$, and the voltage $V_{SRC}$ is transferred to the write memory cells MC.

Additionally, in the program operation, the program voltage $V_{PGM}$ is applied to the selected word line $WL_S$. The program voltage $V_{PGM}$ is larger than the write pass voltage $V_{PASS}$.

Here, the voltage $V_{SRC}$ is applied to the channels of the semiconductor layers 120 corresponding to the write memory cells MC. A comparatively large electric field is generated between such a semiconductor layer 120 and the selected word line $WL_S$. Therefore, electrons in the channel of the semiconductor layer 120 tunnel into the electric charge accumulating film 132 (FIG. 3) via the tunnel insulating film 131 (FIG. 3). Accordingly, the threshold voltages of the write memory cells MC are increased.

On the other hand, the channels of the semiconductor layers 120 corresponding to the inhibited memory cells MC and the channels of the semiconductor layers 120 corresponding to the string unit SUb to the string unit SUe are electrically in a floating state, and the voltage of this channel increases up to around the write pass voltage $V_{PASS}$ by capacitive coupling with the unselected word lines $WL_U$. Between such a semiconductor layer 120 and a selected word line $WL_S$, the electric field smaller than the electric field described above is generated. Thus, electrons in the channel of the semiconductor layer 120 do not tunnel into the electric charge accumulating film 132 (FIG. 3). Therefore, the threshold voltages of the inhibited memory cells MC do not increase.

Next, voltages applied to wirings in the memory block $BLK_B$ will be described.

In the program operation, the ground voltage $V_{SS}$ is applied to the drain-side select gate lines SGDT, SGD corresponding to the memory block $BLK_B$. Accordingly, the drain-side select transistors STDT, STD enter the OFF state.

Additionally, in the program operation, the voltage $V_{BS}$ is applied to the source line SL corresponding to the memory block $BLK_B$, and the ground voltage $V_{SS}$ is applied to the source-side select gate line SGSB. Thus, the source-side select transistors STSB enter the OFF state. Note that as described above, the voltage $V_{BS}$ may be larger than the voltage $V_{SGD}$.

Additionally, in the program operation, the word lines WL corresponding to the memory block $BLK_B$ are set to be in the floating state.

In this state, the select transistors (STDT, STD, STSB) corresponding to the memory block $BLK_B$ enter the OFF state. Accordingly, the memory cells MC in the memory block $BLK_B$ become a state to be electrically separated from both of the bit lines BL and the source line SL.

Figure 8:
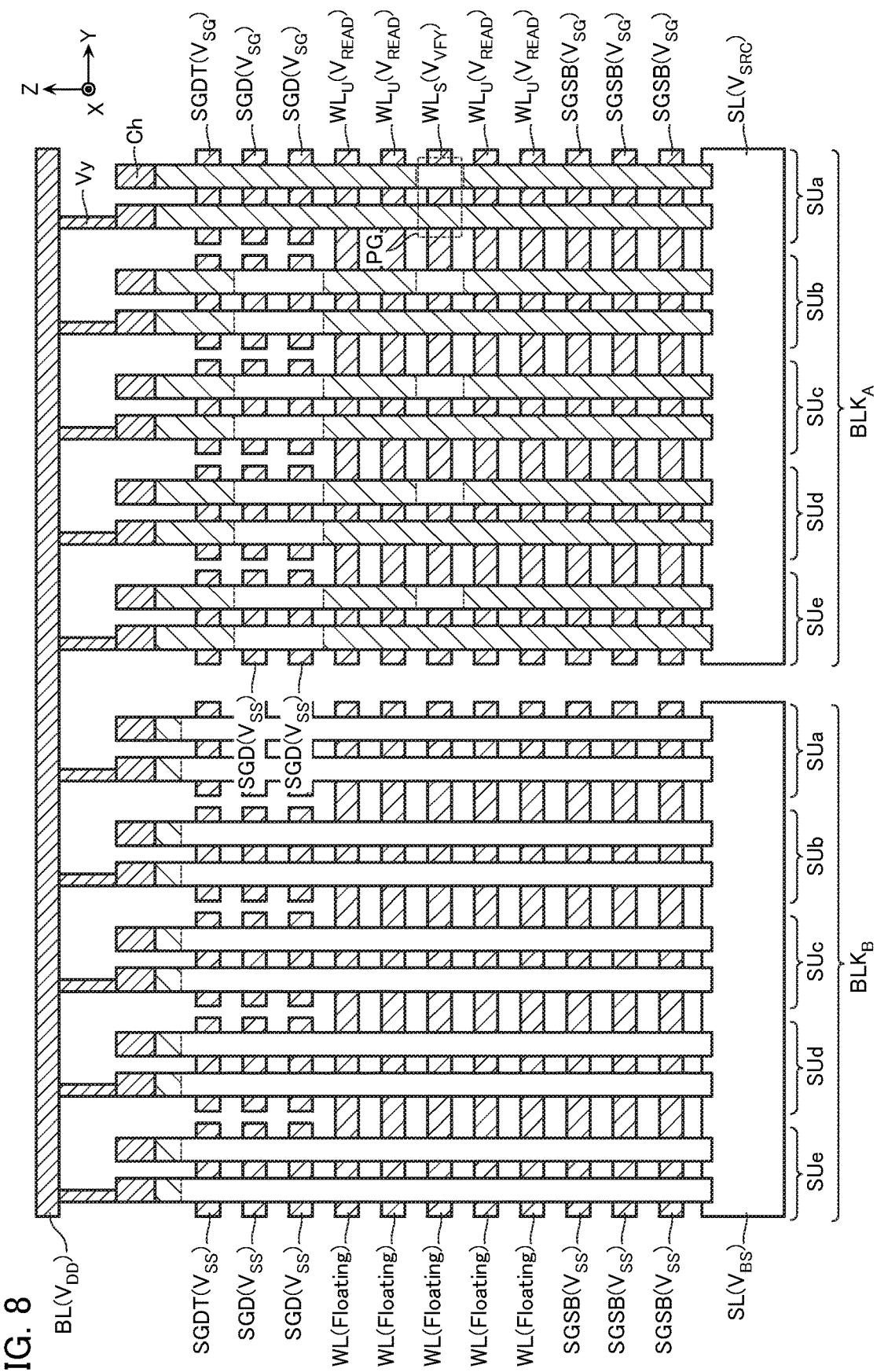
FIG. 8 is a schematic cross-sectional view for describing a verify operation.

FIG. 8 is a schematic cross-sectional view for describing the verify operation.

The verify operation is performed basically similarly to the read operation.

However, in the verify operation, not the read voltage $V_{CGR}$ but the verify voltage $V_{VFY}$ is applied to the selected word line $WL_S$. The verify voltage $V_{VFY}$ is any of the verify voltages $V_{VFYA}$ to $V_{VFYG}$ described with reference to FIG. 4A.

In the read operation, for example, the voltage $V_{DD}$ is applied to all of the bit lines BL corresponding to the page portion PG. On the other hand, in the verify operation, for example, the voltage $V_{DD}$ may be applied to the bit lines BL corresponding to the specific state according to the loop count $n_W$, and the voltage $V_{SRC}$ may be applied to the other bit lines BL.

[Erase Operation]

Figure 9:
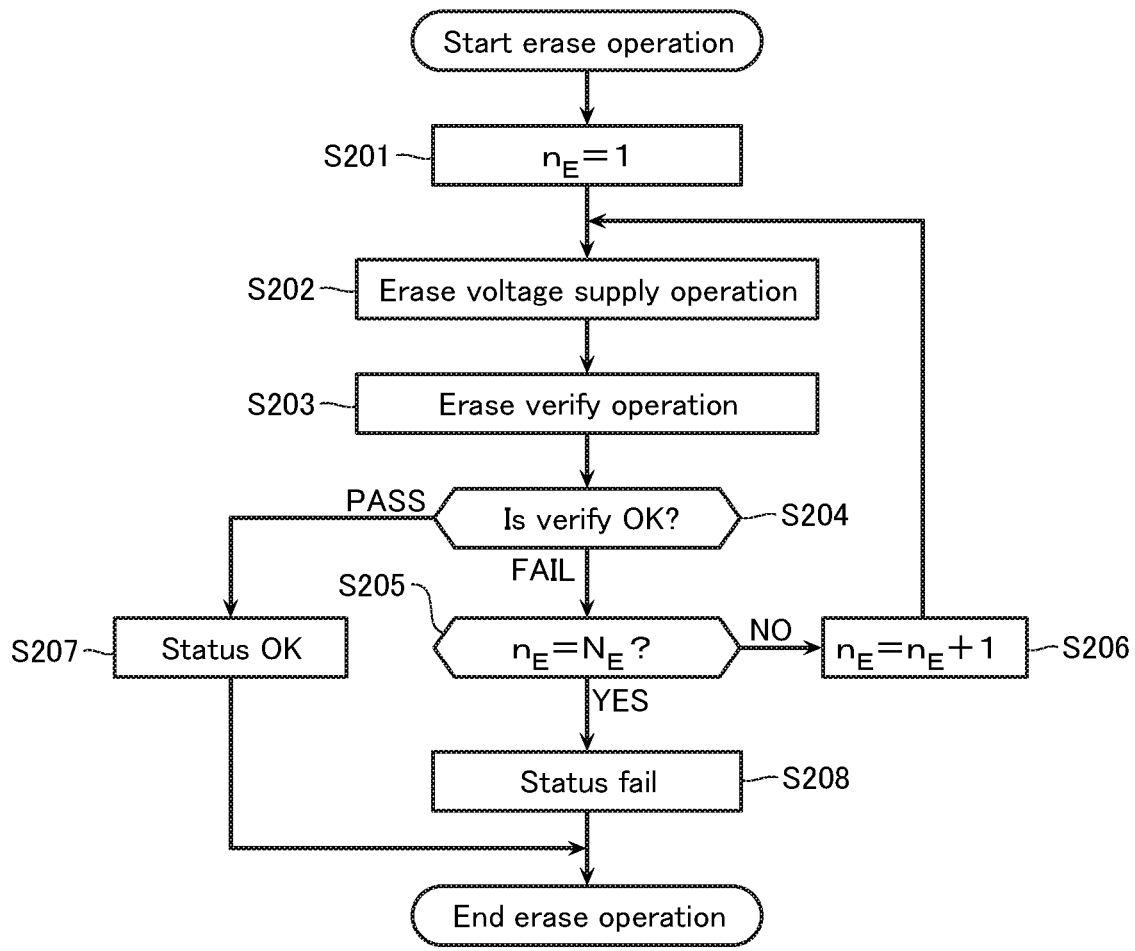
FIG. 9 is a flowchart for describing an erase operation.

FIG. 9 is a flowchart for describing the erase operation.

In the following description, an example of performing the erase operation on the memory block $BLK_A$ will be described.

At Step S201, for example, as illustrated in FIG. 9, a loop count $n_E$ is set to 1. The loop count $n_E$ is a variable indicative of the count of erase loop.

At Step S202, an erase voltage supply operation is performed. The erase voltage supply operation is an operation that applies the ground voltage $V_{SS}$ to the word lines WL and applies an erase voltage $V_{ERA}$ to either or both of the source line SL and the bit lines BL to reduce the threshold voltages of the memory cells MC.

At Step S203, an erase verify operation is performed. The erase verify operation is an operation for applying an erase verify voltage $V_{VFYEr}$ (FIG. 4A) to the word lines WL, detecting the ON state/OFF state of the memory cells MC, and detecting whether the threshold voltages of the memory cells MC have reached the target value or not.

At Step S204, the result of the erase verify operation is determined. For example, when the number of the memory cells MC whose threshold voltages have not reached the target value is a certain number or more, it is determined to be verify FAIL and the procedure proceeds to Step S205. On the other hand, for example, when the number of the memory cells MC whose threshold voltages have not reached the target value is less than a certain number, it is determined to be verify PASS and the procedure proceeds to Step S207.

At Step S205, whether the loop count $n_E$ has reached a predetermined number $N_E$ or not is determined. When it has not reached the predetermined number $N_E$, the procedure proceeds to Step S206. When it has reached the predetermined number $N_E$, the procedure proceeds to Step S208.

At Step S206, 1 is added to the loop count $n_E$, and the procedure proceeds to Step S202. At Step S206, for example, a predetermined voltage is added to the erase voltage $V_{ERA}$. Therefore, the erase voltage $V_{ERA}$ increases together with the increase in the loop count $n_E$.

At Step S207, status data indicative of normal termination of the erase operation is stored in the status register in the peripheral circuit PC (FIG. 1) to terminate the erase operation.

At Step S208, status data indicative of failing to normally terminate the erase operation is stored in the status register in the peripheral circuit PC (FIG. 1) to terminate the erase operation.

Figure 10:
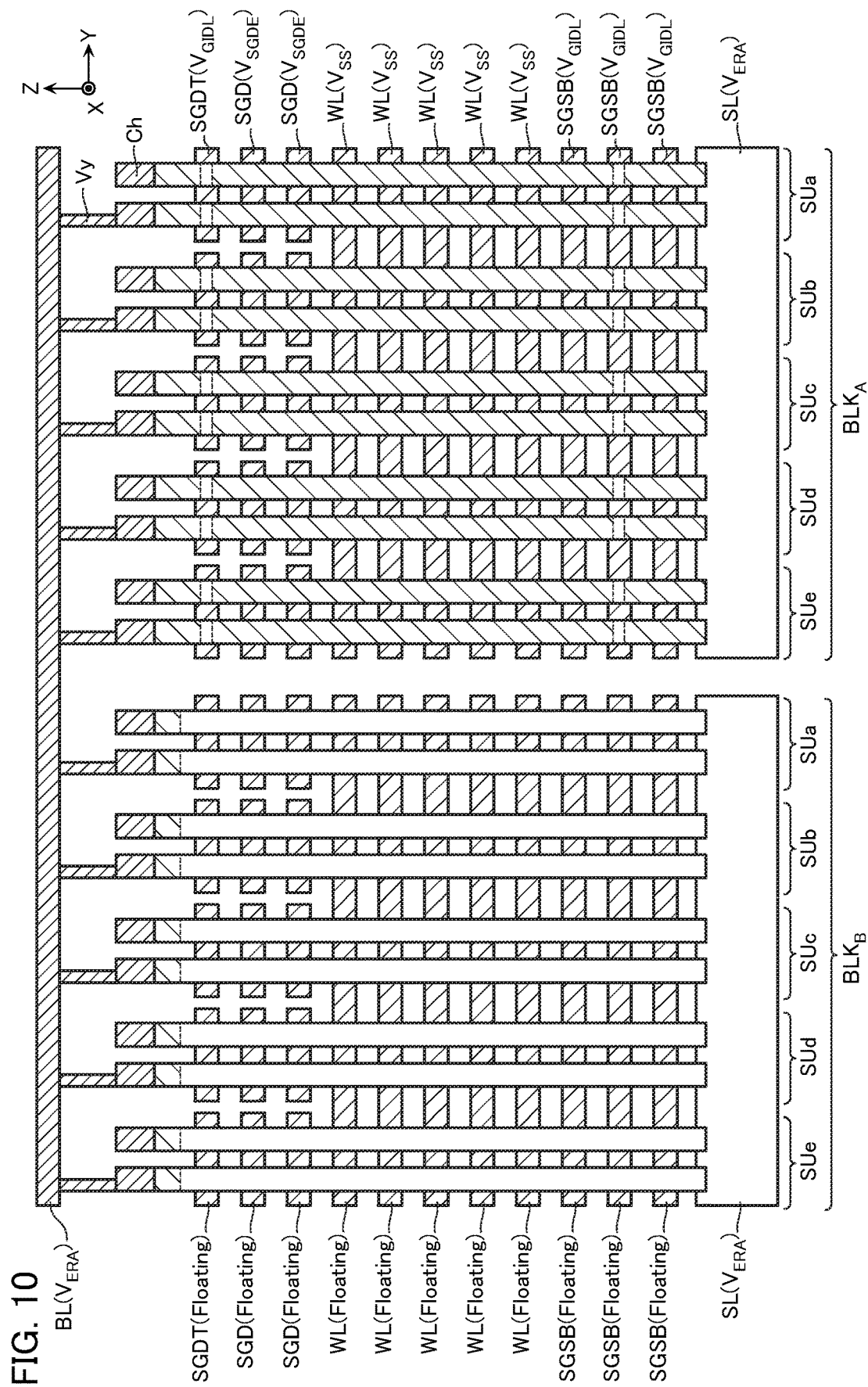
FIG. 10 is a schematic cross-sectional view for describing an erase voltage supply operation.

FIG. 10 is a schematic cross-sectional view for describing the erase voltage supply operation.

First, voltages applied to wirings in the memory block $BLK_A$ will be described.

In the erase voltage supply operation, the erase voltage $V_{ERA}$ is applied to the bit lines BL and the source line SL corresponding to the memory block $BLK_A$. The erase voltage $V_{ERA}$, for example, may be larger than the program voltage $V_{PGM}$ or may be equal to the program voltage $V_{PGM}$.

In the erase voltage supply operation, a voltage $V_{GIDL}$ is applied to the drain-side select gate line SGDT and the source-side select gate line SGSB corresponding to the memory block $BLK_A$. The voltage $V_{GIDL}$ is smaller than the erase voltage $V_{ERA}$. Thus, Gate Induced Drain Leakage (GIDL) occurs in the drain-side select transistors STDT and the source-side select transistors STSB, and electron and hole pair occurs. The electrons generated in the drain-side select transistors STDT move to the bit line BL side, and the holes move to the memory cell MC side. The electrons generated in the source-side select transistors STSB move to the source line SL side, and the holes move to the memory cell MC side.

Additionally, in the erase voltage supply operation, a voltage $V_{SGDE}$ is applied to the drain-side select gate lines SGD corresponding to the memory block $BLK_A$. The voltage $V_{SGDE}$ is smaller than the erase voltage $V_{ERA}$. Thus, the hole channels are formed in the channel regions of the drain-side select transistors STD.

Additionally, in the erase voltage supply operation, the ground voltage $V_{SS}$ is applied to the word lines WL. Thus, the holes in the channels of the semiconductor layer 120 tunnel into the electric charge accumulating film 132 (FIG.

3) via the tunnel insulating film 131 (FIG. 3). Accordingly, the threshold voltages of the memory cells MC are reduced.

Next, voltages applied to wirings in the memory block $BLK_B$ will be described.

In the erase voltage supply operation, the erase voltage $V_{ERA}$ is applied to the source line SL corresponding to the memory block $BLK_B$.

In the erase voltage supply operation, the word lines WL and the select gate lines (SGDT, SGD, SGSB) corresponding to the memory block $BLK_B$ are set to be in a floating state.

In this state, in association with the application of the erase voltage $V_{ERA}$ to the bit lines BL and the source line SL, the voltages of the semiconductor layers 120 and the voltages of the word lines WL and the select gate lines (SGDT, SGD, SGSB) increase up to around the erase voltage $V_{ERA}$. In this state, the voltage difference hardly occurs between the semiconductor layers 120 and the word lines WL. Accordingly, the holes do not tunnel from the semiconductor layer 120 to the electric charge accumulating film 132 (FIG. 3). Therefore, the threshold voltages of the memory cells MC do not decrease. In this state, the voltage difference hardly occurs between the semiconductor layers 120 and the select gate lines (SGDT, SGD, SGSB). Thus, GIDL does not occur in the drain-side select transistors STDT or the source-side select transistors STSB.

Figure 11:
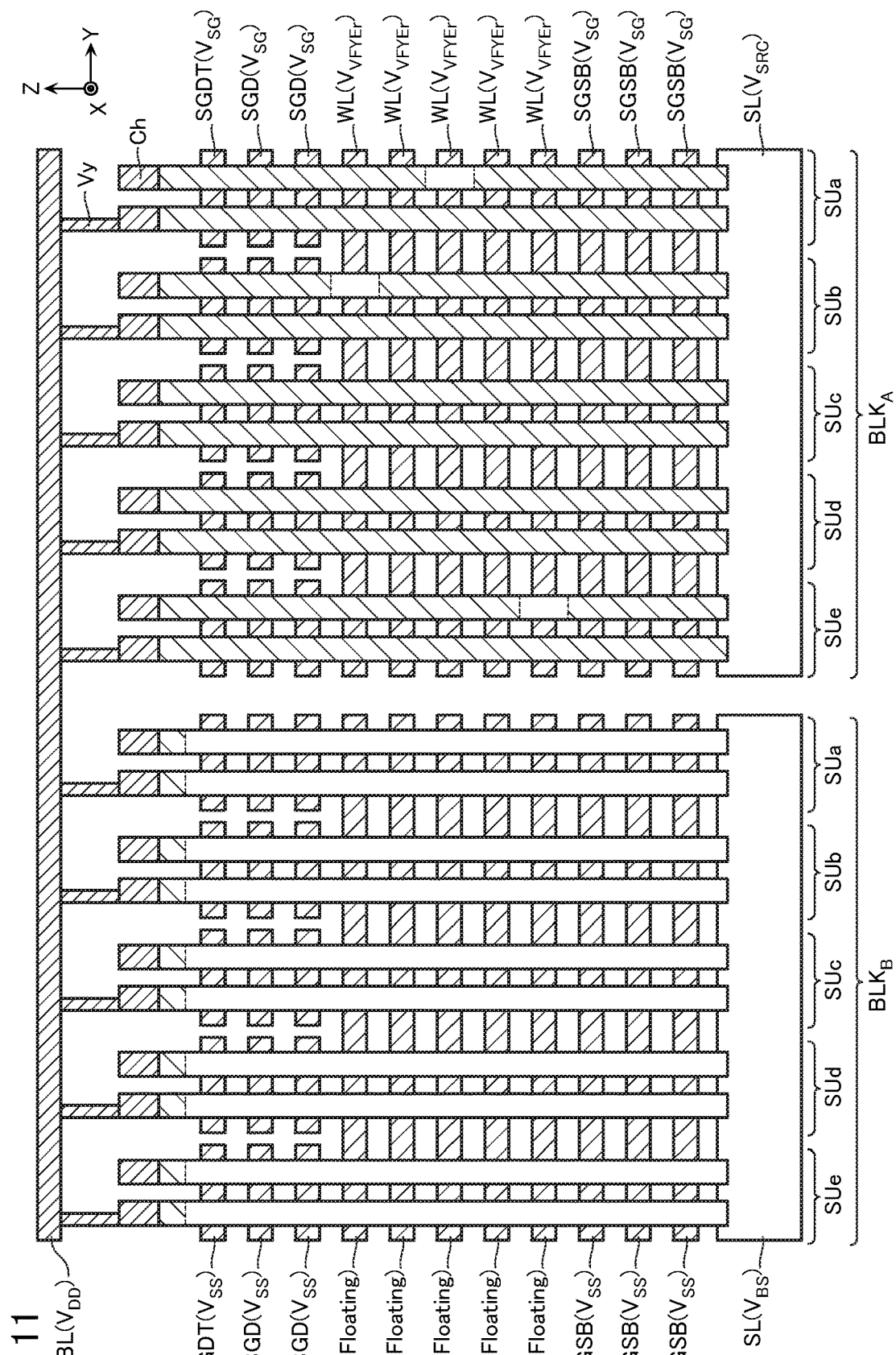
FIG. 11 is a schematic cross-sectional view for describing an erase verify operation.

FIG. 11 is a schematic cross-sectional view for describing the erase verify operation.

The erase verify operation is basically performed similarly to the read operation.

However, in the erase verify operation, neither the read voltage $V_{CGR}$ nor the read pass voltage $V_{READ}$, but the erase verify voltage $V_{VFYEr}$ described with reference to FIG. 4A is applied to the word lines WL.

[Comparative Example]

Figure 12:
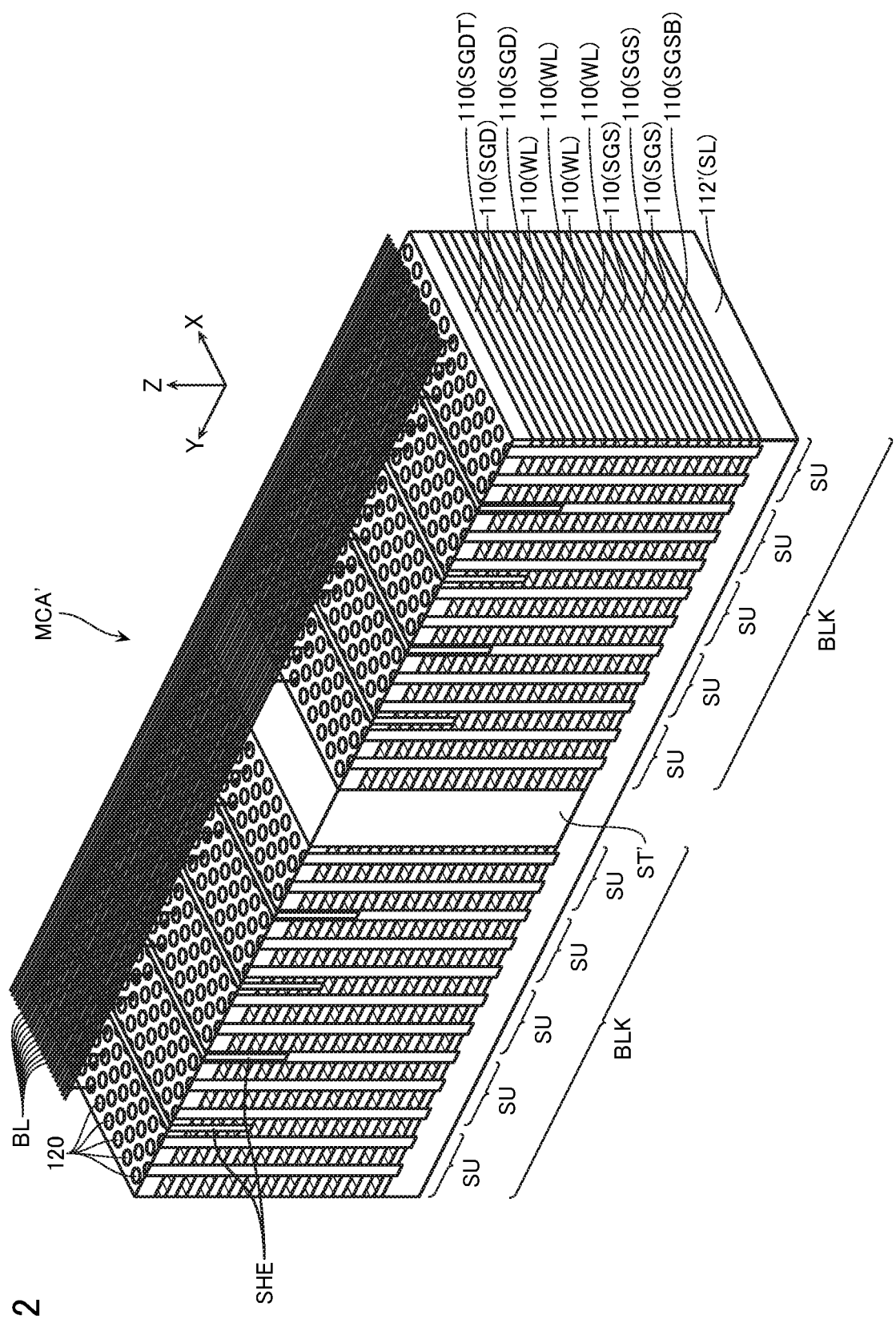
FIG. 12 is a schematic perspective view illustrating a configuration of a part of a memory cell array MCA' according to a comparative example.

FIG. 12 is a schematic perspective view illustrating a configuration of a part of a memory cell array MCA' according to a comparative example.

The memory cell array MCA' according to the comparative example includes a conductive layer 112' and an inter-memory block insulating layer ST' instead of the conductive layer 112 and the inter-memory block insulating layer ST. The conductive layer 112' is disposed in common over a plurality of memory blocks BLK. The inter-memory block insulating layer ST' does not separate the conductive layer 112'.

In the memory cell array MCA' according to the comparative example, source-side select gate lines SGS are disposed between the word lines WL and the source-side select gate line SGSB.

[Effects]

In the erase operation of the semiconductor memory device according to the comparative example, GIDL is generated in the drain-side select transistors STDT and the source-side select transistors STSB. To employ the method, due to an influence of GIDL, electric charge amounts in the electric charge accumulating films 132 corresponding to the drain-side select transistors STDT and the source-side select transistors STSB varies in some cases. Accordingly, the threshold voltages of the drain-side select transistors STDT and the source-side select transistors STSB vary in some cases.

Therefore, in the memory cell array MCA' according to the comparative example, the drain-side select transistors STD used to select the memory cells MC are disposed between the memory cells MC and the bit lines BL, in addition to the drain-side select transistors STDT used to generate GIDL. The configuration allows preferably electrically conducting the memory cells MC and the bit lines BL or electrically separating them.

Additionally, the source-side select transistors used to select the memory cells MC are disposed between the memory cells MC and the source line SL, in addition to the source-side select transistors STSB used to generate GIDL. The configuration allows preferably electrically conducting the memory cells MC and the source line SL or electrically separating them.

However, in the memory cell array MCA' according to the comparative example, a part of the plurality of conductive layers 110 stacked in the Z-direction needs to be used as the source-side select gate lines SGS. Therefore, an aspect ratio of a via-hole (hereinafter referred to as a "memory hole") to form the semiconductor layer 120 increases, possibly increasing a degree of difficulty of processing.

Here, to reduce the aspect ratio of the memory hole, for example, it is considered that the function of the source-side select transistors used to select the memory cell MC is included in the source-side select transistors STSB used to generate GIDL, and thus the source-side select transistors used to select the memory cell MC are omitted.

However, as described above, the threshold voltages of the source-side select transistors STSB possibly varies due to the influence of GIDL. Moreover, the channel regions of the source-side select transistors STSB contain N-type impurities, such as phosphorus (P), in some cases. For this reason, the source-side select transistors STSB possibly enters a normally on state.

For example, when the source-side select transistors STSB enter the ON state in the program operation, the voltages of the channels of the inhibited memory cells MC becomes voltages lower than the write pass voltage $V_{PASS}$, and this possibly causes erroneous writing.

To reduce this, for example, it is considered that the voltage $V_{BS}$ larger than that of the source-side select gate lines SGSB is applied to the conductive layer 112', so as to cause the gate-source voltages of the source-side select transistors STSB to be in a relationship of reverse bias, thus causing the source-side select transistors STSB to enter the OFF state.

However, the conductive layer 112' is a configuration common to the plurality of memory blocks BLK and is disposed across a comparatively wide area. Therefore, in the write operation, when the program operation and the verify operation are repeatedly performed in alternation, the voltage $V_{BS}$ is applied the conductive layer 112' in the program operation and the voltage $V_{SRC}$ is applied to the conductive layer 112' in the verify operation, charge and discharge need to be repeatedly performed on the conductive layer 112', and the time required for the write operation possibly increases.

Therefore, the semiconductor memory device according to the first embodiment has the structure in which the conductive layer 112 is separated for each of the memory blocks BLK. Since the conductive layer 112 is separated for each of the memory blocks BLK, compared with the conductive layer 112', capacitance can be substantially reduced. Therefore, the write operation can be performed at high speed. Additionally, even when the voltage $V_{BS}$ has a comparatively large value (for example, a value larger than the voltage $V_{SGD}$ in FIG. 7), the charge and discharge of the conductive layer 112 can be performed at high speed.

Additionally, in the read operation, the verify operation, and the erase verify operation according to the first embodiment, as described with reference to FIG. 5, FIG. 8, and FIG. 11, the voltage $V_{BS}$ is applied to the source line SL corresponding to the unselected memory block $BLK_B$ while the ground voltage $V_{SS}$ is applied to the source-side select gate line SGSB. This causes gate-source voltages of the source-side select transistors STSB to be in the relationship of reverse bias, thus causing the source-side select transistors STSB to enter the OFF state.

Here, in the read operation, the verify operation, and the erase verify operation, the word lines WL corresponding to the unselected memory block $BLK_B$ is in the floating state, and due to an influence of capacitive coupling with another wiring, the voltage value possibly varies. Therefore, in a case where the voltage of the channels of the semiconductor layers 120 corresponding to the unselected memory block $BLK_B$ are fixed and the voltages of the word lines WL varies due to an influence of the external electric field, an exchange of carriers occurs between the semiconductor layers 120 and the conductive layer 112 corresponding to the unselected memory block $BLK_B$, and the read operation possibly becomes unstable.

According to the first embodiment, in the read operation, the verify operation, and the erase verify operation, the exchange of carriers between the semiconductor layers 120 and the conductive layer 112 corresponding to the unselected memory block $BLK_B$ can be suppressed. Accordingly, the read operation, the verify operation, and the erase verify operation can be stably performed.

Second Embodiment

In the first embodiment, the methods of performing the read operation, the write operation, and the erase operation have been exemplified. However, the methods are merely examples, and specific voltages or the like are appropriately adjustable. For example, in the read operation, the verify operation, and the erase verify operation according to the first embodiment, as described with reference to FIG. 5, FIG. 8, and FIG. 11, the source-side select transistors STSB corresponding to the unselected memory blocks BLK are set to the OFF state. However, in the read operation, the verify operation, and the erase verify operation, for example, the source lines SL corresponding to the unselected memory blocks BLK may be separated from the voltage generation circuit to be in the floating state.

The semiconductor memory device according to the second embodiment is basically configured similarly to the semiconductor memory device according to the first embodiment. However, the read operation, the verify operation, and the erase verify operation according to the second embodiment are different from those of the first embodiment.

Figure 13:
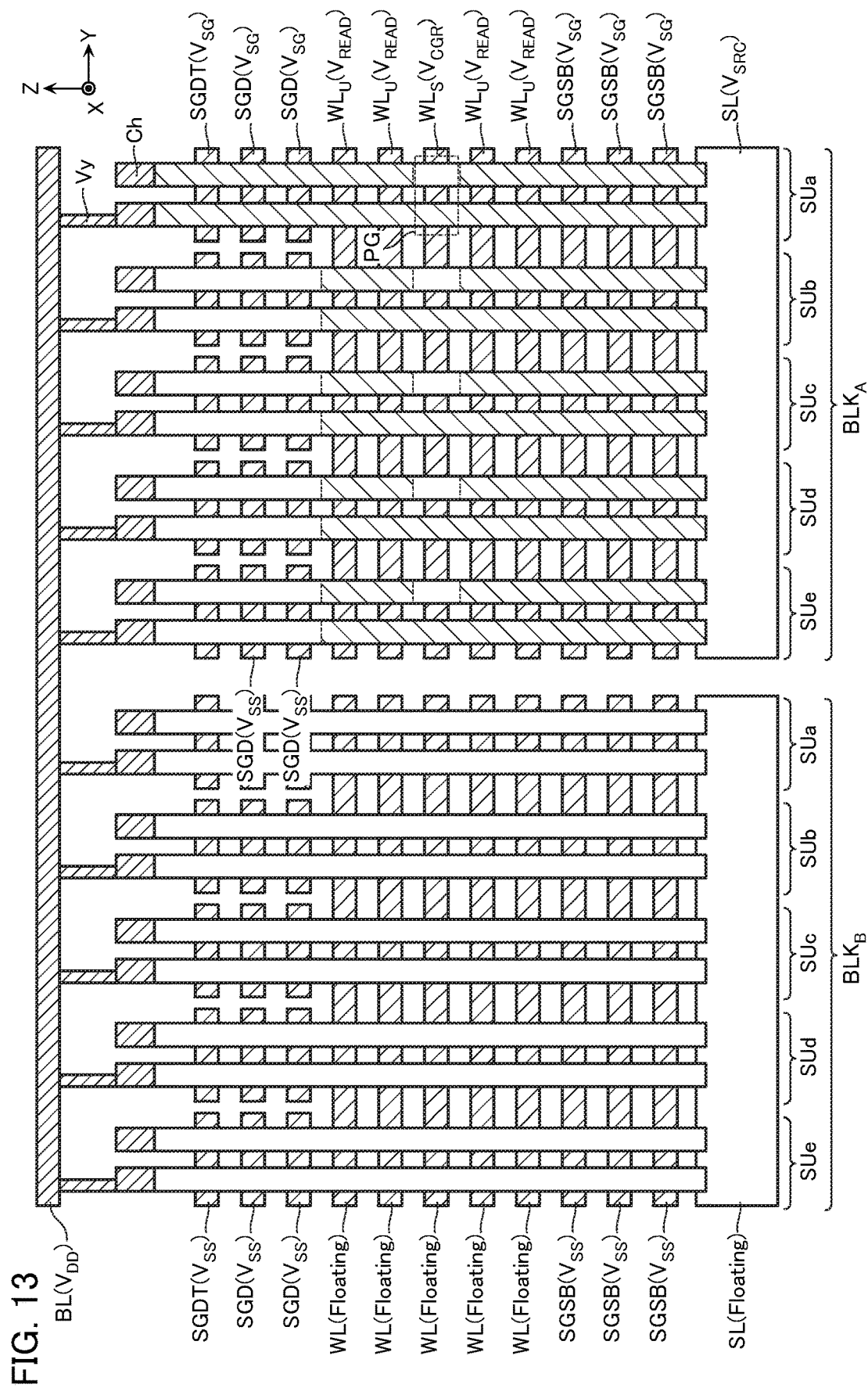
FIG. 13 is a schematic cross-sectional view for describing a read operation of a semiconductor memory device according to a second embodiment.

FIG. 13 is a schematic cross-sectional view for describing the read operation of the semiconductor memory device according to the second embodiment. The read operation according to the second embodiment is performed basically similarly to the read operation according to the first embodiment. However, in the read operation according to the second embodiment, the source line SL corresponding to the unselected memory block $BLK_B$ is separated from the voltage generation circuit and enters the floating state.

Although the illustration is omitted, in the verify operation and the erase verify operation of the semiconductor memory device according to the second embodiment as well, the source line SL corresponding to the unselected memory block $BLK_B$ is separated from the voltage generation circuit and enters the floating state.

In this method as well, similarly to the first embodiment, in the read operation, the verify operation, and the erase verify operation, entrance of carriers (electrons) in the semiconductor layers 120 corresponding to the unselected memory block $BLK_B$ can be suppressed. Accordingly, the read operation, the verify operation, and the erase verify operation can be stably performed.

Third Embodiment

Next, an application example to a further specific structure of the semiconductor memory device according to the first embodiment or the second embodiment will be described.

[Structure of Memory Die MD]

Figure 14:
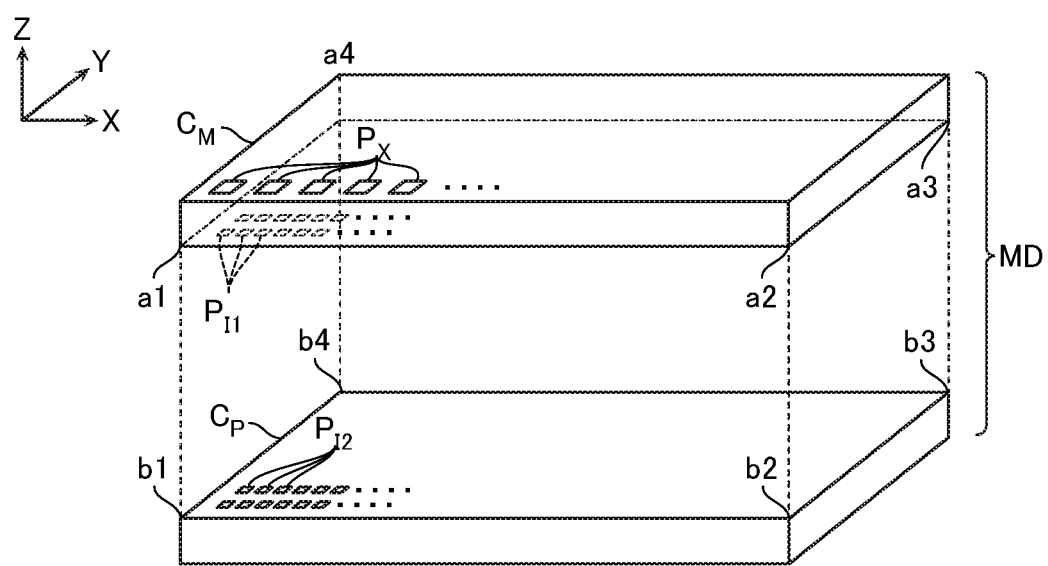
FIG. 14 is a schematic exploded perspective view illustrating an exemplary configuration of a semiconductor memory device according to a third embodiment.

FIG. 14 is a schematic exploded perspective view illustrating an exemplary configuration of a semiconductor memory device according to the third embodiment. As illustrated in FIG. 14, the memory die MD according to the third embodiment includes a chip $C_M$ on the memory cell array MCA (FIG. 1) side and a chip $C_P$ on the peripheral circuit PC (FIG. 1) side.

On an upper surface of the chip $C_M$, a plurality of external pad electrodes $P_X$ connectable to external connecting terminals, such as bonding wires (not illustrated), are disposed. Additionally, a plurality of bonding electrodes $P_{I1}$ are disposed on a lower surface of the chip $C_M$. A plurality of bonding electrodes $P_{I2}$ are disposed on an upper surface of the chip $C_P$. Hereinafter, regarding the chip $C_M$, a surface on which the plurality of bonding electrodes $P_{I1}$ are disposed is referred to as a front surface and a surface on which the plurality of external pad electrodes $P_X$ are disposed is referred to as a back surface. Additionally, regarding the chip $C_P$, a surface on which the plurality of bonding electrodes $P_{I2}$ are disposed is referred to as a front surface and a surface on the side opposite to the front surface is referred to as a back surface. In the example illustrated in the drawing, the front surface of the chip $C_P$ is disposed above the back surface of the chip $C_P$ and the back surface of the chip $C_M$ is disposed above the front surface of the chip $C_M$.

The chip $C_M$ and the chip $C_P$ are disposed such that the front surface of the chip $C_M$ is opposed to the front surface of the chip $C_P$. The respective plurality of bonding electrodes $P_{I1}$ are disposed correspondingly to the plurality of bonding electrodes $P_{I2}$, and are disposed at positions where the plurality of bonding electrodes $P_{I1}$ can be bonded to the plurality of bonding electrodes $P_{I2}$. The bonding electrodes $P_{I1}$ and the bonding electrodes $P_{I2}$ have a function of bonding the chip $C_M$ and the chip $C_P$ and electrically conducting them.

Note that in the example of FIG. 14, corner portions a1, a2, a3, a4 of the chip $C_M$ correspond to corner portions b1, b2, b3, b4 of the chip $C_P$, respectively.

Figure 15:
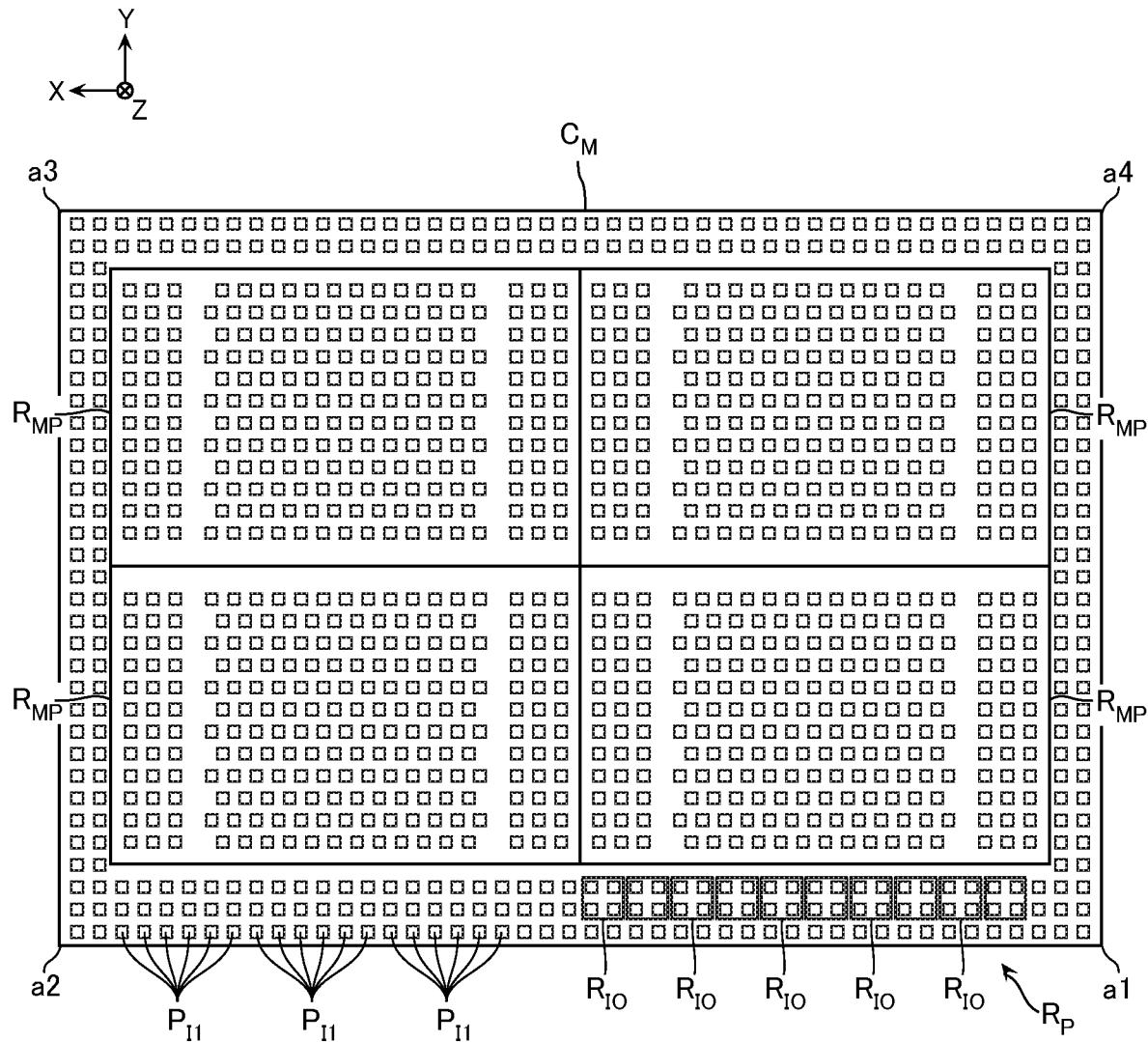
FIG. 15 is a schematic bottom view illustrating an exemplary configuration of a chip $C_M$.
Figure 16:
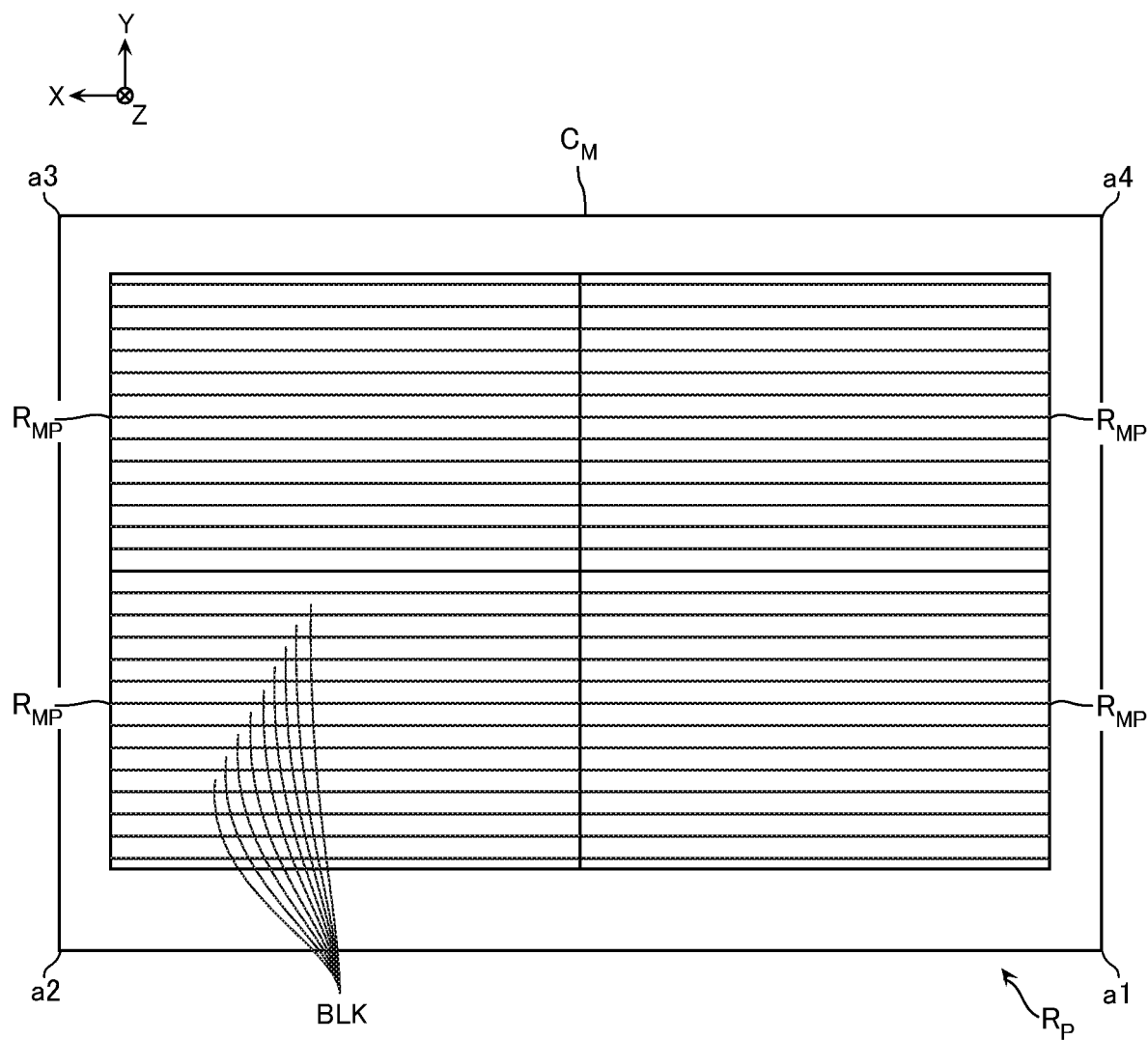
FIG. 16 is a schematic bottom view illustrating an exemplary configuration of the chip $C_M$.
Figure 17:
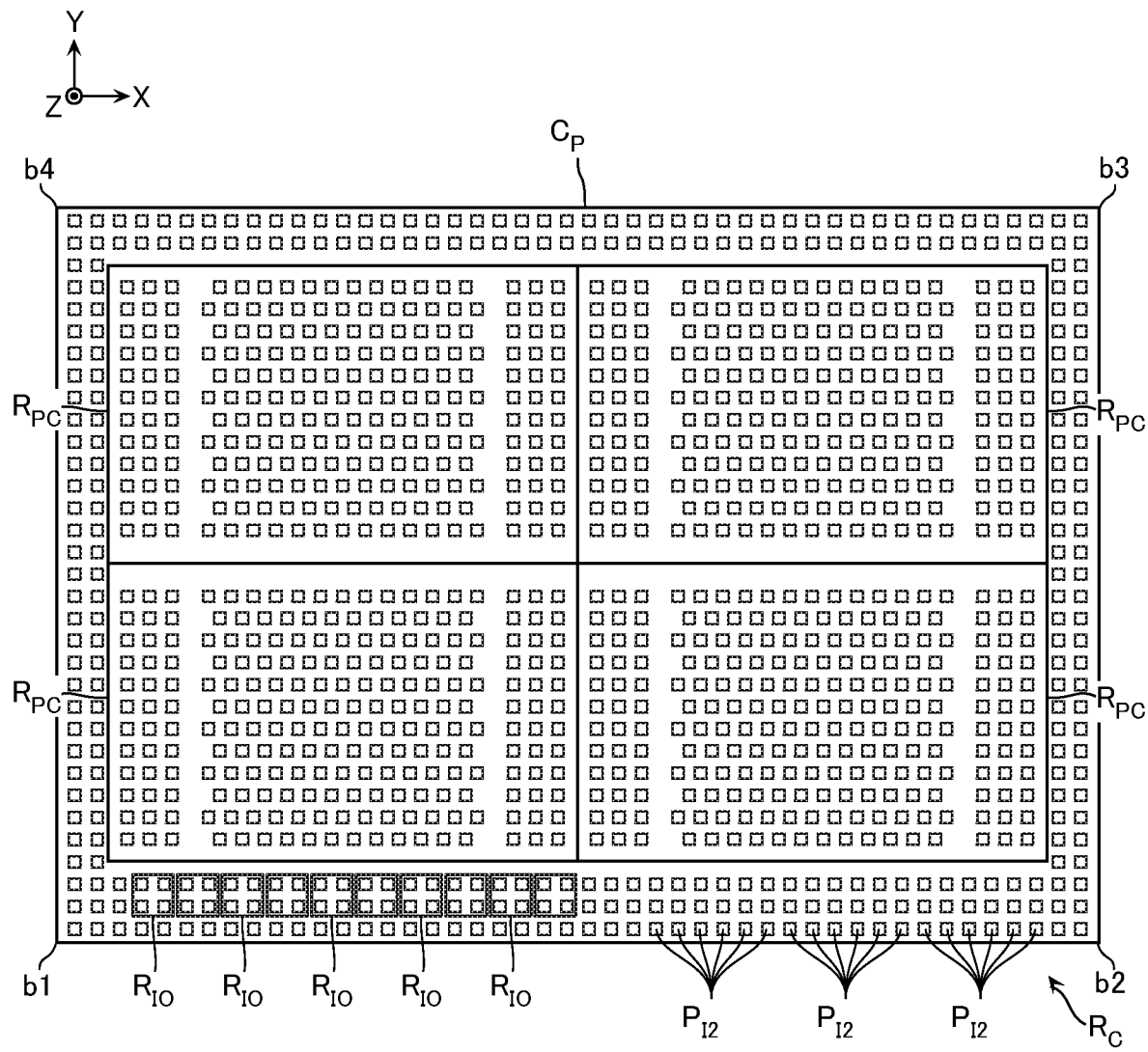
FIG. 17 is a schematic plan view illustrating an exemplary configuration of a chip $C_P$.
Figure 18:
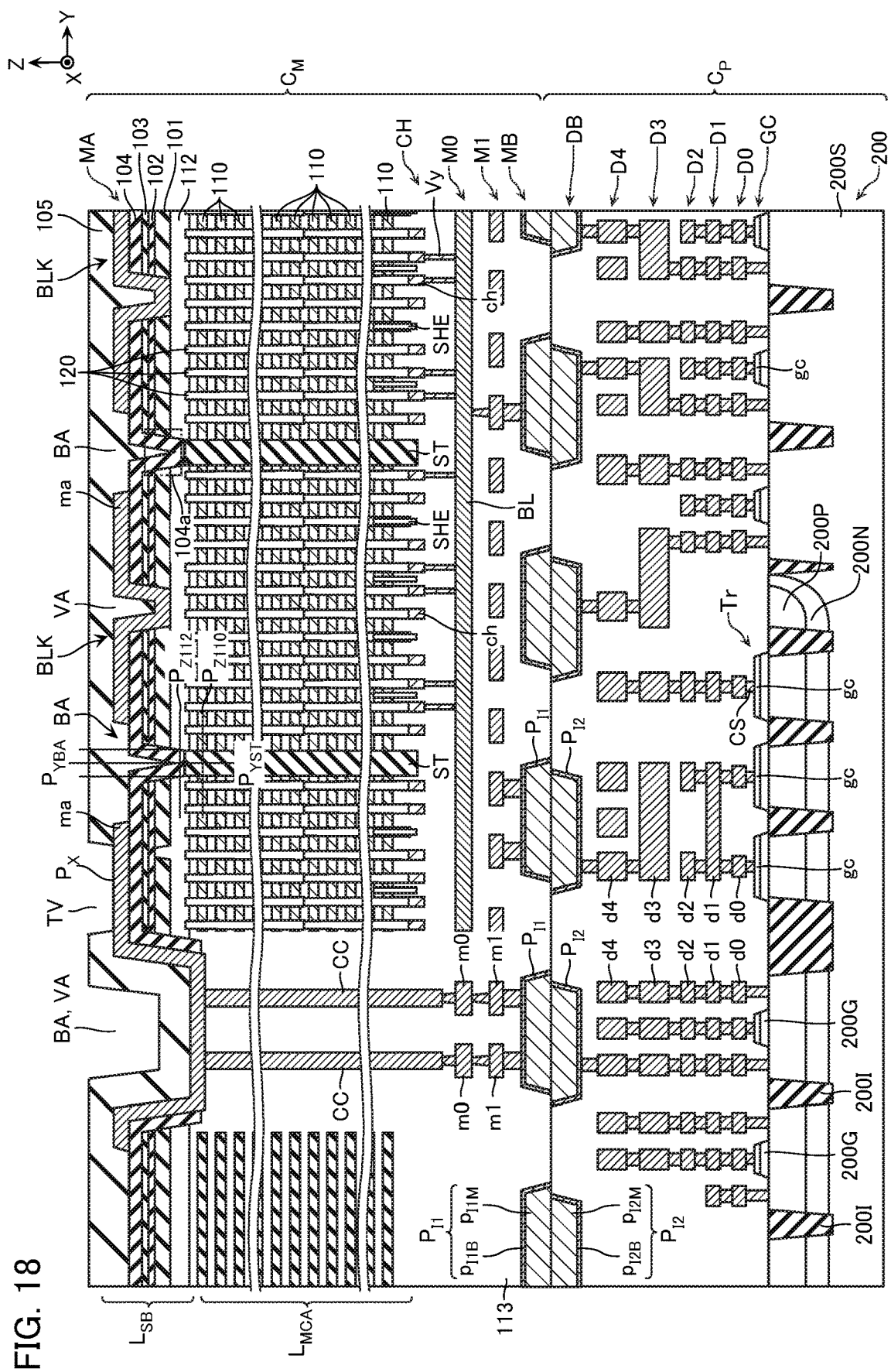
FIG. 18 is a schematic cross-sectional view illustrating a configuration of a part of a memory die MD.
Figure 19:
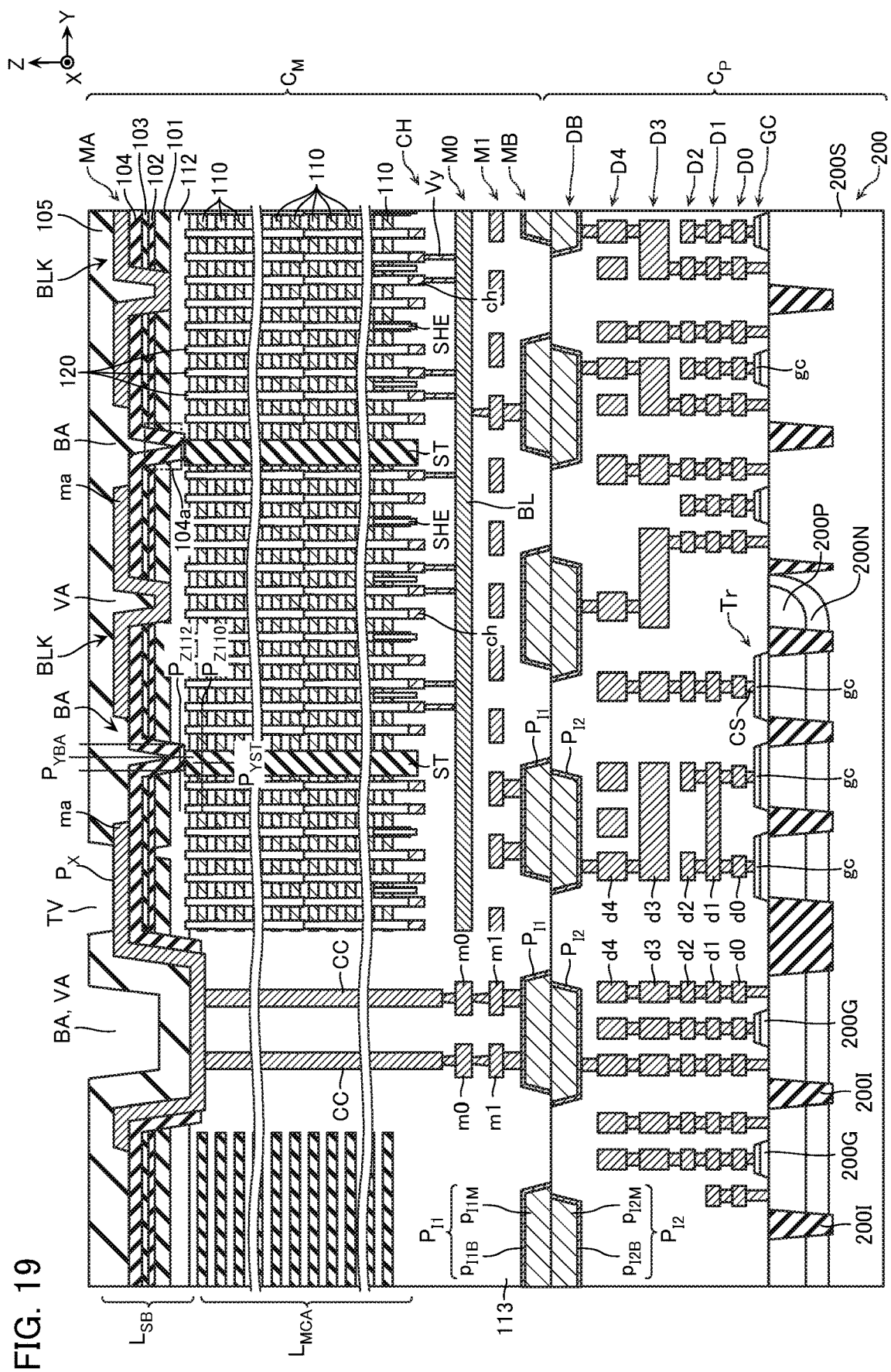
FIG. 19 is a schematic cross-sectional view illustrating another exemplary configuration of a part of the memory die MD.

FIG. 15 and FIG. 16 are schematic bottom views illustrating the exemplary configuration of the chip $C_M$. FIG. 16 omits some configurations, such as the bonding electrodes $P_{I1}$. FIG. 17 is a schematic plan view illustrating an exemplary configuration of the chip C. FIG. 18 is a schematic cross-sectional view illustrating a configuration of a part of the memory die MD. FIG. 19 is a schematic cross-sectional view illustrating another exemplary configuration of a part of the memory die MD.

[Structure of Chip $C_M$]

For example, as illustrated in FIG. 16, the chip $C_M$ includes four memory plane regions $R_{MP}$ arranged in the X-direction and the Y-direction. Additionally, the chip $C_M$ includes a peripheral region $R_P$ disposed at one end side in the Y-direction with respect to the four memory plane regions $R_{MP}$. As illustrated in FIG. 15, the peripheral region $R_P$ includes a plurality of input/output regions R10 arranged in the X-direction.

For example, as illustrated in FIG. 18, the chip $C_M$ includes a memory cell array layer $L_{MCA}$, a plurality of wiring layers CH, M0, M1, MB disposed below the memory cell array layer $L_{MCA}$, and a base structure $L_{SB}$ disposed above the memory cell array layer $L_{MCA}$.

[Structure of Memory Cell Array Layer $L_{MCA}$ of Chip $C_M$ in Memory Plane Region $R_{MP}$]

For example, as illustrated in FIG. 16, the memory cell array layer $L_{MCA}$ includes the plurality of memory blocks BLK arranged in the Y-direction. The memory block BLK is basically configured similarly to the memory block BLK according to the first embodiment described with reference to FIG. 1 to FIG. 3. However, as illustrated in FIG. 18, the memory block BLK according to the third embodiment is vertically upside down compared with the memory block BLK described with reference to FIG. 2, and memory cells MC are disposed below the conductive layers 112.

[Structure of Memory Cell Array Layer $L_{MCA}$ of Chip $C_M$ in Peripheral Region $R_P$]

For example, as illustrated in FIG. 18, the peripheral region $R_P$ includes a plurality of via-contact electrodes CC corresponding to the external pad electrode $P_X$. These plurality of via-contact electrodes CC penetrate insulating layers 113, such as silicon oxide (SiO$_2$), extend in the Z-direction, and have upper ends electrically connected to the external pad electrode $P_X$.

[Structure of Wiring Layers CH, M0, M1, MB in Chip $C_M$]

For example, as illustrated in FIG. 18, a plurality of wirings included in the wiring layers CH, M0, M1, MB are, for example, electrically connected to either or both of configurations in the memory cell array layer $L_{MCA}$ and configurations in the chip $C_P$.

The wiring layer CH includes a plurality of via-contact electrodes ch as the plurality of wirings. These plurality of via-contact electrodes ch may include, for example, a stacked film of a barrier conductive film of titanium nitride (TiN) or the like and a metal film of tungsten (W) or the like. The via-contact electrodes ch are disposed correspondingly to the plurality of semiconductor layers 120 and connected to lower ends of the plurality of semiconductor layers 120.

The wiring layer M0 includes a plurality of wirings m0. The plurality of wirings m0 may include, for example, a stacked film of a barrier conductive film, such as titanium nitride (TiN), and a metal film, such as copper (Cu). Note that a part of the plurality of wirings m0 function as the bit lines BL. The bit line BL, for example, are arranged in the X-direction and extends in the Y-direction.

The wiring layer M1 includes a plurality of wirings m1. These plurality of wirings m1 may include, for example, a stacked film of a barrier conductive film of titanium nitride (TiN) or the like and a metal film of tungsten (W) or the like.

The wiring layer MB includes the plurality of bonding electrodes $P_{I1}$. These plurality of bonding electrodes $P_{I1}$ may include, for example, a stacked film of a barrier conductive film $p_{I1B}$, such as titanium nitride (TiN), and a metal film $p_{I1M}$, such as copper (Cu).

[Structure of Substrate Body Structure $L_{SB}$ in Chip $C_M$]

For example, as illustrated in FIG. 18, the substrate body structure $L_{SB}$ includes the conductive layers 112 disposed on an upper surface of the memory cell array layer $L_{MCA}$, insulating layers 101, 102, 103, 104 disposed on upper surfaces of the conductive layers 112, a back side wiring layer (a metal wiring layer) MA disposed on an upper surface of the insulating layer 104, and an insulating layer 105 disposed on an upper surface of the back side wiring layer MA.

The conductive layer 112 according to the third embodiment is basically configured similarly to the conductive layer 112 according to the first embodiment. However, the conductive layer 112 according to the third embodiment is separated in the Y-direction, not via the inter-memory block insulating layer ST, but a part of the insulating layer 104.

The insulating layers 101, 103, 104 contain, for example, silicon oxide (SiO$_2$). The insulating layer 102 contains, for example, silicon nitride (SiN). The insulating layers 101, 102, 103 are disposed on the upper surfaces of the conductive layer 112. The substrate body structure $L_{SB}$ includes trenches BA that separates the conductive layers 112 and the insulating layers 101, 102, 103. The insulating layer 104 is disposed on an upper surface of the insulating layer 103 and a bottom surface and an inner wall surface of the trench BA. Hereinafter, a part disposed inside the trench BA in the insulating layer 104 is referred to as an "insulating layer 104a" in some cases. The insulating layer 104a is in contact with an upper surface of the inter-memory block insulating layer ST and side surfaces in the Y-direction of the two conductive layers 112 adjacent in the Y-direction.

Note that in the example of FIG. 18, a center position $P_{YBA}$ in the Y-direction of the trench BA (the insulating layer 104a) and a center position $P_{YST}$ in the Y-direction of the inter-memory block insulating layer ST are approximately matched. However, the inter-memory block insulating layer ST and the trench BA are positioned in different processes. Therefore, for example, as illustrated in FIG. 19, the center position $P_{YBA}$ in the Y-direction of the trench BA (the insulating layer 104a) may be different from the center position $P_{YST}$ in the Y-direction of the inter-memory block insulating layer ST.

Here, to specify the center position $P_{YBA}$, for example, in the cross-sectional surface as illustrated in FIG. 18 or FIG. 19, a line $P_{Z112}$ indicating the intermediate position in the Z-direction between the upper surface and a lower surface of the conductive layer 112 may be specified. Additionally, two intersection points corresponding to this line $P_{Z112}$ and the two inner wall surfaces (contact surfaces between the conductive layer 112 and the insulating layer 104a) of one focusing trench BA may be specified. The intermediate position in the Y-direction of these two intersection points may be specified as the center position $P_{YBA}$.

Similarly, to specify the center position $P_{YST}$, for example, in the cross-sectional surface as illustrated in FIG. 18 or FIG. 19, a line $P_{Z110}$ indicating the intermediate position in the Z-direction between an upper surface and a lower surface of one of the plurality of conductive layers 110 may be specified. Additionally, two intersection points corresponding to this line $P_{Z110}$ and both side surfaces (the contact surfaces between the conductive layer 110 and the inter-memory block insulating layer ST) in the Y-direction of one focusing inter-memory block insulating layer ST may be specified. The intermediate position in the Y-direction of these two intersection points may be specified as the center position $P_{YST}$.

The back side wiring layer MA includes a plurality of wirings ma. These plurality of wirings ma may include aluminum (Al) or the like. The substrate body structure $L_{SB}$ includes trenches VA that separate the insulating layers 101, 102, 103, 104. The wirings ma are disposed on the upper surface of the insulating layer 104 and bottom surfaces and the inner wall surfaces of the trenches VA.

A part of the plurality of wirings ma functions as parts of the source lines SL (FIG. 1). Such a plurality of wirings ma are disposed corresponding to the plurality of memory blocks BLK arranged in the Y-direction. Each of these wirings ma is connected to the upper surface of the conductive layer 112.

Additionally, another part of the plurality of wirings ma functions as the external pad electrodes $P_X$ (FIG. 14). Such a plurality of wirings ma are disposed corresponding to the plurality of input/output regions R10 (FIG. 15) arranged in the X-direction. Such wirings ma are connected to upper ends of the via-contact electrodes CC in the memory cell array layer $L_{MCA}$ and an upper surface of the insulating layer 113 via the trenches BA, VA separating the conductive layer 112 and the insulating layers 101, 102, 103, 104. Parts of such wirings ma are disposed on the upper surface of the insulating layer 104 and each part becomes a connecting portion with a bonding wire (not illustrated) or the like.

The insulating layer 105 is, for example, a passivation layer that contains a resin material, such as polyimide, in an upper layer portion. The substrate body structure $L_{SB}$ includes a trench TV that separates the insulating layer 105. Connecting portions of the wirings ma that function as the external pad electrodes $P_X$ with the bonding wires or the like are exposed to the outside of the memory die MD via this trench TV.

[Structure of Chip $C_P$]

For example, as illustrated in FIG. 17, the chip $C_P$ includes four peripheral circuit regions $R_{PC}$ arranged in the X-direction and Y-direction correspondingly to the memory plane regions $R_{MP}$. Additionally, the chip $C_P$ includes a circuit region $R_C$ disposed in a region opposed to the peripheral region $R_P$. The circuit region $R_C$ includes the plurality of input/output regions R10 arranged in the X-direction.

Additionally, for example, as illustrated in FIG. 18, the chip $C_P$ includes a semiconductor substrate 200, electrode layer GC disposed above the semiconductor substrate 200, and wiring layers D0, D1, D2, D3, D4, DB disposed above the electrode layer GC.

[Structure of Semiconductor Substrate 200 in Chip $C_P$]

The semiconductor substrate 200, for example, contains P-type silicon (Si) containing P-type impurities, such as boron (B). On a surface of the semiconductor substrate 200, for example, N-type well regions 200N containing N-type impurities, such as phosphorus (P), P-type well regions 200P containing P-type impurities, such as boron (B), semiconductor substrate regions 200S in which the N-type well region 200N or the P-type well region 200P is not disposed, and insulating regions 200I are disposed. The respective N-type well regions 200N, P-type well regions 200P, and semiconductor substrate regions 200S function as parts of a plurality of transistors Tr, parts of a plurality of capacitors, and the like constituting the peripheral circuit PC (FIG. 1).

[Structure of Electrode Layer GC in Chip $C_P$]

For example, as illustrated in FIG. 18, the electrode layer GC is disposed on the upper surface of the semiconductor substrate 200 via an insulating layer 200G. The electrode layer GC includes a plurality of electrodes gc opposed to the surface of the semiconductor substrate 200 in the Z-direction. Additionally, the respective regions in the semiconductor substrate 200 and the plurality of electrodes gc included in the electrode layer GC are connected to via-contact electrodes CS.

The respective N-type well regions 200N, P-type well regions 200P, and semiconductor substrate regions 200S in the semiconductor substrate 200 function as, for example, channel regions of the plurality of transistors Tr and one electrodes of the plurality of capacitors constituting the peripheral circuit PC (FIG. 1).

The respective plurality of electrodes gc included in the electrode layer GC function as, for example, gate electrodes of the plurality of transistors Tr and the other electrodes of the plurality of capacitors constituting the peripheral circuit PC (FIG. 1).

The via-contact electrodes CS extend in the Z-direction and have lower ends connected to the upper surface of the semiconductor substrate 200 or the upper surfaces of the electrodes gc. In connecting parts between the via-contact electrodes CS and the semiconductor substrate 200, impurity regions (not illustrated) containing N-type impurities or P-type impurities are disposed. The via-contact electrodes CS may include, for example, a stacked film of a barrier conductive film of titanium nitride (TiN) or the like and a metal film of tungsten (W) or the like.

[Structure of Wiring Layers D0, D1, D2, D3, D4, DB in Chip $C_P$]

For example, as illustrated in FIG. 18, a plurality of wirings included in the wiring layers D0, D1, D2, D3, D4, DB, for example, are electrically connected to either or both of the configurations in the memory cell array layer $L_{MCA}$ and the configurations in the chip $C_P$.

Each of the wiring layers D0, D1, D2 includes a plurality of wirings d0, d1, d2. These plurality of wirings d0, d1, d2 may include, for example, a stacked film of a barrier conductive film of titanium nitride (TiN) or the like and a metal film of tungsten (W) or the like.

Each of the wiring layers D3, D4 includes a plurality of wirings d3, d4. The plurality of wirings d3, d4 may include, for example, a stacked film of a barrier conductive film, such as titanium nitride (TiN), and a metal film, such as copper (Cu).

The wiring layer DB includes the plurality of bonding electrodes $P_{I2}$. These plurality of bonding electrodes $P_{I2}$ may include, for example, a stacked film of a barrier conductive film $p_{I2B}$, such as titanium nitride (TiN), and a metal film $p_{I2M}$, such as copper (Cu).

Here, when metal films $p_{I1M}$, $p_{I2M}$, such as copper (Cu), are used for the bonding electrode $P_{I1}$ and the bonding electrode $P_{I2}$, the metal film $p_{I1M}$ and the metal film $p_{I2M}$ are integrated, and confirmation of the mutual boundary is difficult. However, the bonding structure can be confirmed by distortion of the shape of bonding the bonding electrode $P_{I1}$ and the bonding electrode $P_{I2}$ due to the positional displacement of the bonding and the positional displacement (generation of discontinuous portions in side surfaces) of the barrier conductive films $P_{I1B}$, $p_{I2B}$. Additionally, when the bonding electrode $P_{I1}$ and the bonding electrode $P_{I2}$ are formed by damascene method, the respective side surfaces have a tapered shape. In view of this, in the shape of the cross-sectional surface along the Z-direction in the part where the bonding electrode $P_{I1}$ and the bonding electrode $P_{I2}$ are bonded, sidewall does not have a linear shape, but a non-rectangular shape. Additionally, when the bonding electrode $P_{I1}$ and the bonding electrode $P_{I2}$ are bonded, a structure of covering a bottom surface, the side surfaces, and an upper surface of each Cu forming them by a barrier metal is formed. In contrast to this, in a wiring layer using general Cu, an insulating layer (for example, SiN or SiCN) having an oxidation reduction function of Cu is disposed on the upper surface of Cu, and a barrier metal is not disposed. In view of this, even when the positional displacement of the bonding does not occur, distinction with a general wiring layer is possible.

[Manufacturing Method]

Figure 20:
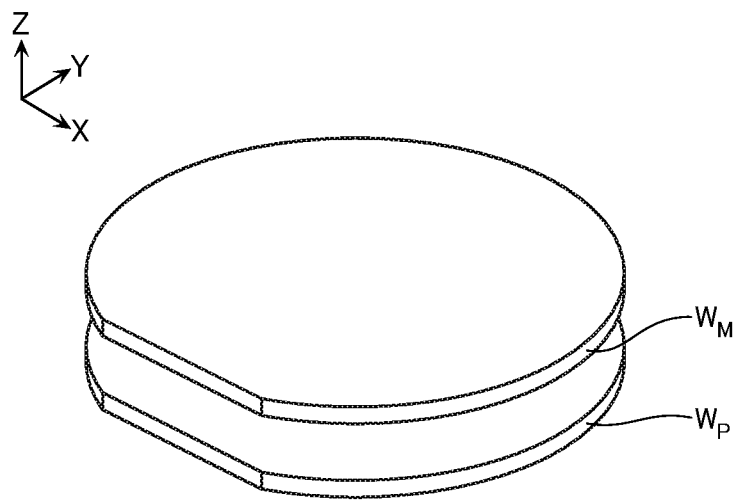
FIG. 20 is a schematic perspective view for describing a manufacturing method according to the third embodiment.
Figure 21:
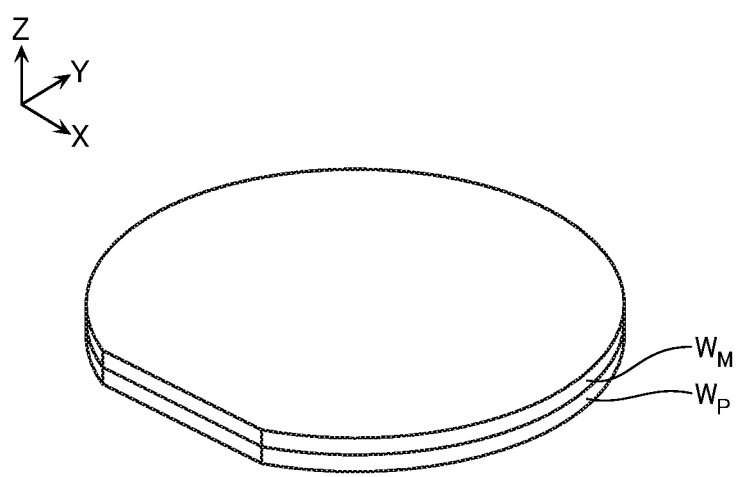
FIG. 21 is a schematic perspective view for describing the manufacturing method.

Next, with reference to FIG. 20 to FIG. 30, the manufacturing method of the memory die MD will be described. FIG. 20 and FIG. 21 are schematic perspective views for describing the manufacturing method. FIG. 22 to FIG. 30 are schematic cross-sectional views for describing the manufacturing method. FIG. 22 to FIG. 30 illustrate the cross-sectional surface corresponding to FIG. 18.

To manufacture the memory die MD according to the embodiment, a wafer $W_M$ corresponding to the chip $C_M$ and a wafer $W_P$ corresponding to the chip $C_P$ are manufactured. As illustrated in FIG. 20 and FIG. 21, these two wafers $W_M$, $W_P$ are bonded and are individualized by dicing.

Figure 22:
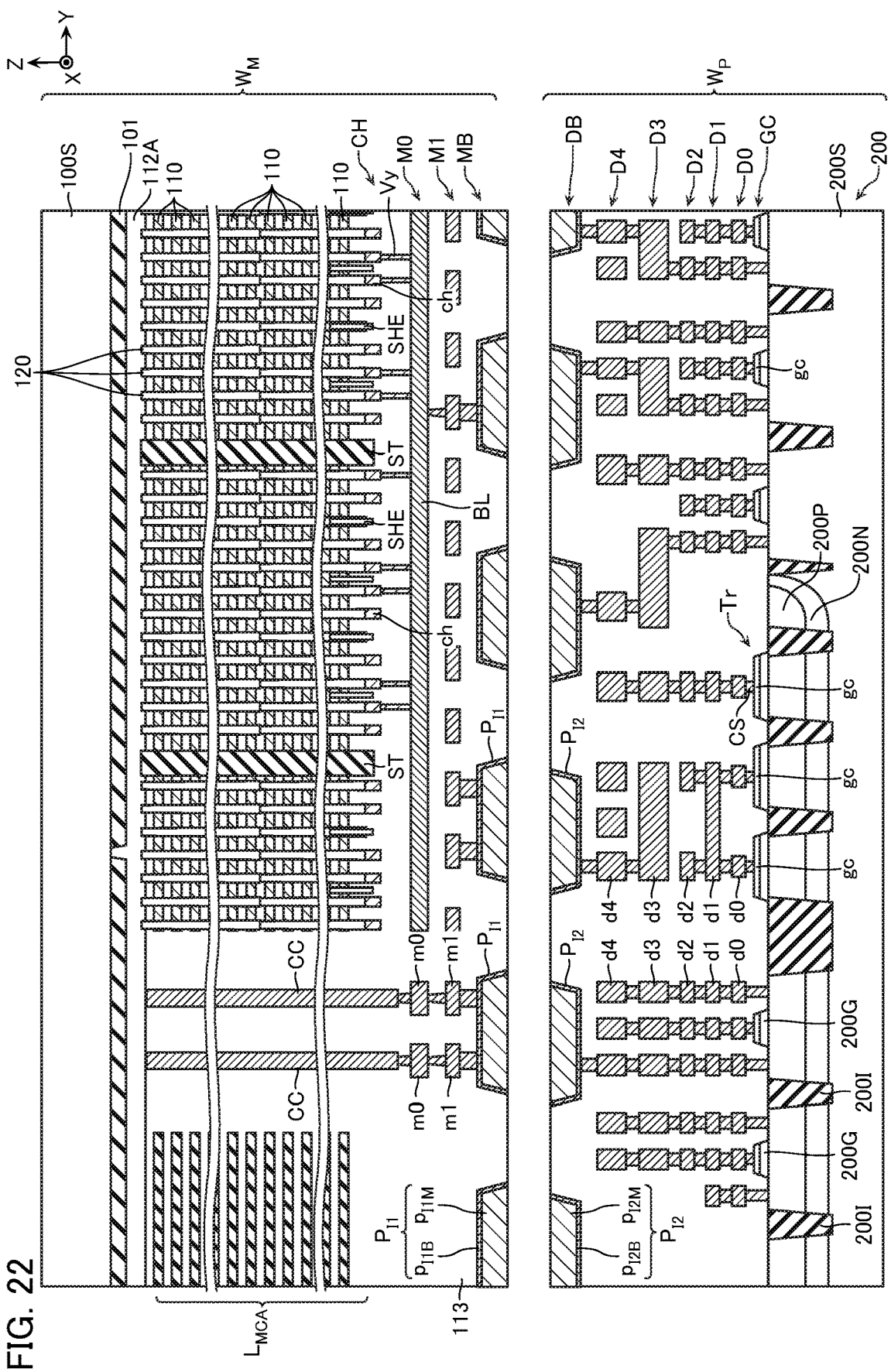
FIG. 22 is a schematic cross-sectional view for describing the manufacturing method.

FIG. 22 illustrates the configuration of the wafers $W_M$, $W_P$ in a phase of bonding the wafers $W_M$, $W_P$. At this phase, the wafer $W_M$ has a configuration approximately similar to the chip $C_M$ described with reference to FIG. 18 and the like. However, the wafer $W_M$ does not have a configuration corresponding to the substrate body structure $L_{SB}$. On an upper surface of the memory cell array layer $L_{MCA}$, a conductive layer 112A, an insulating layer 101, and a substrate 100S are disposed. The conductive layer 112A is configured basically similar to the conductive layer 112. However, the conductive layer 112A is formed across the approximately entire surface of the wafer $W_M$. Additionally, at this phase, the wafer $W_P$ has a configuration similar to the chip $C_P$ described with reference to FIG. 18 and the like.

Figure 23:
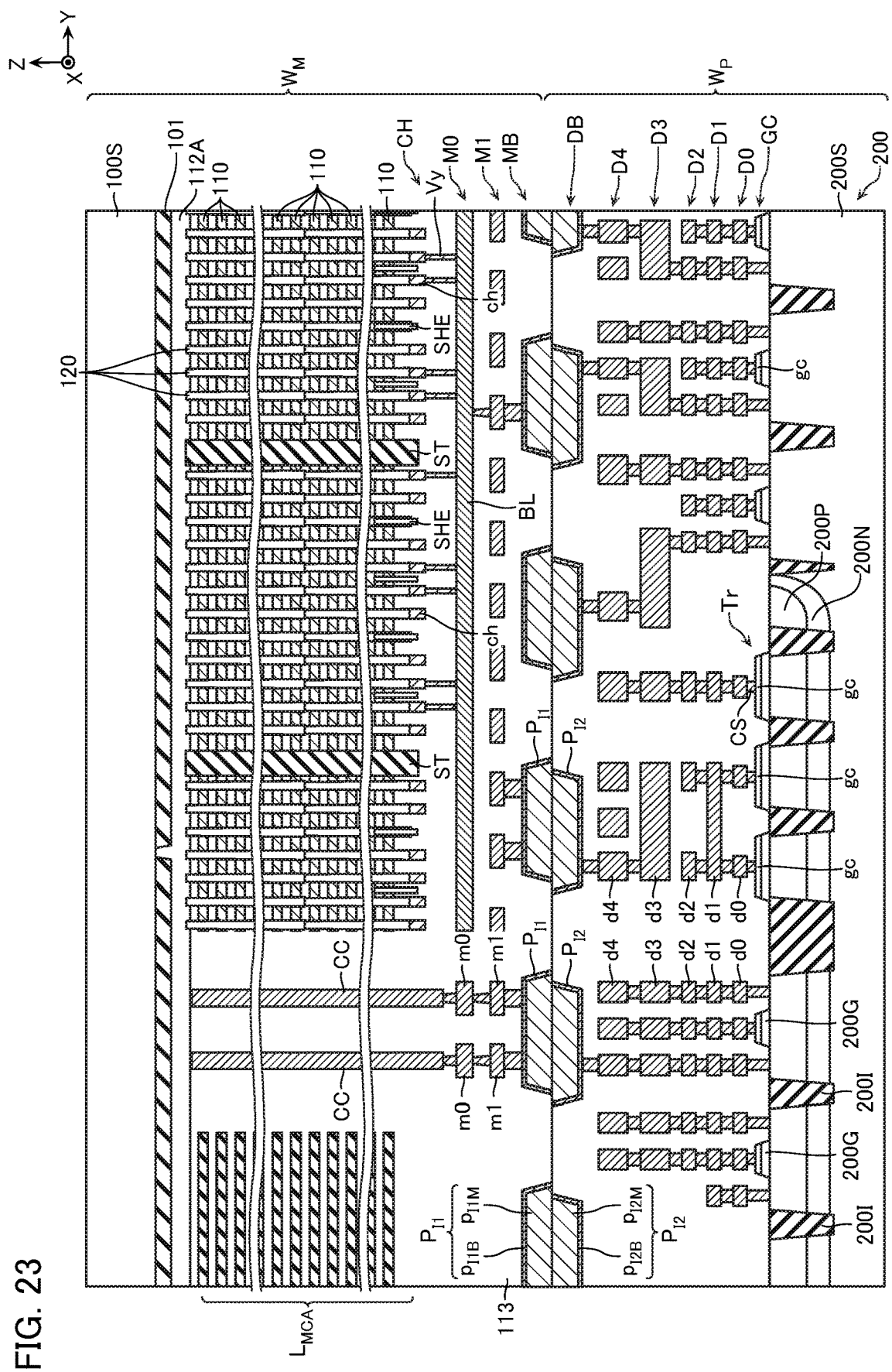
FIG. 23 is a schematic cross-sectional view for describing the manufacturing method.

To manufacture the memory die MD according to the embodiment, as illustrated in FIG. 23, the wafers $W_M$, $W_P$ are bonded. In this process, the plurality of bonding electrodes $P_{I1}$ in the wafer $W_M$ and the plurality of bonding electrodes $P_{I2}$ in the wafer $W_P$ are connected to one another.

Figure 24:
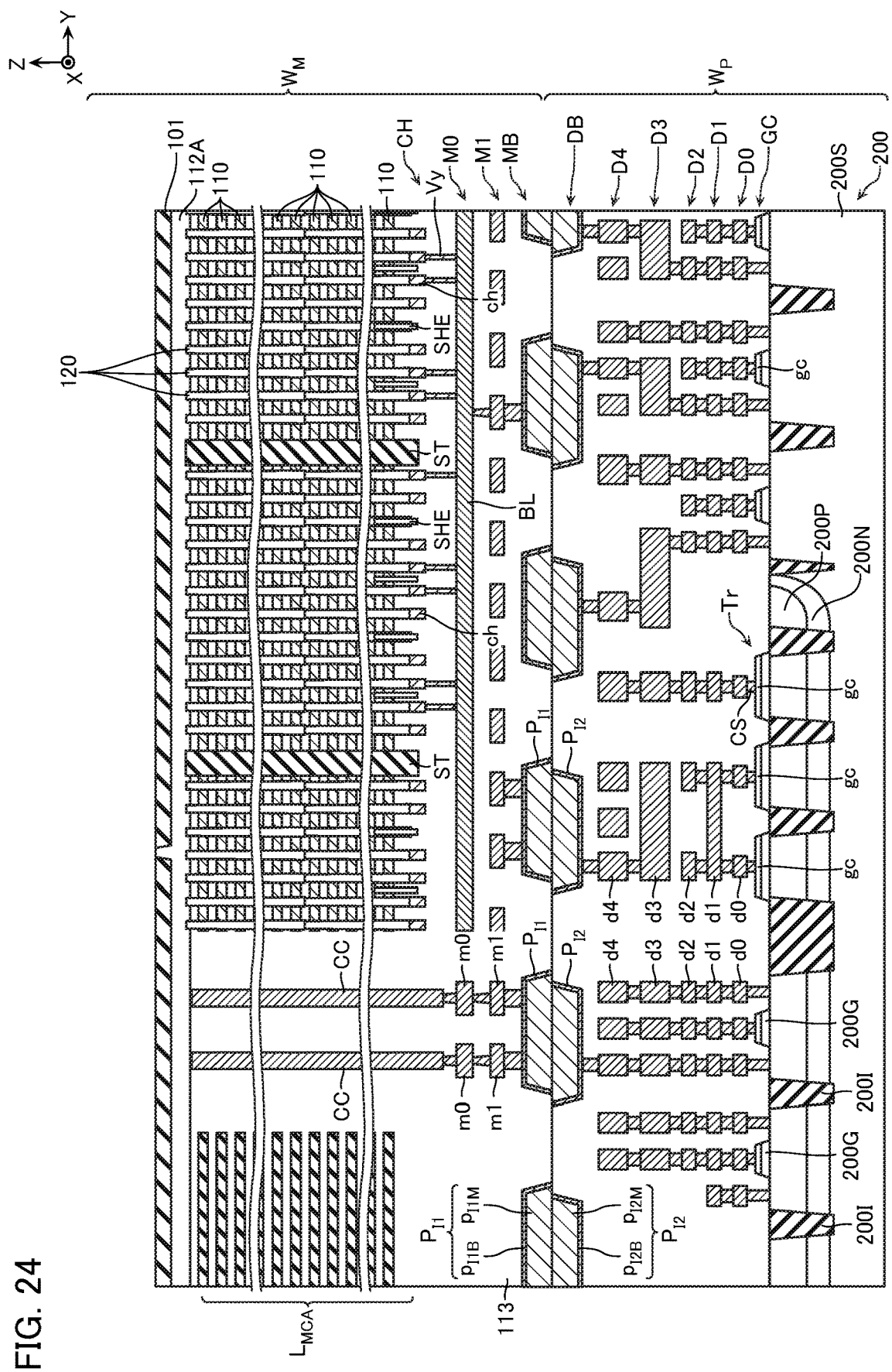
FIG. 24 is a schematic cross-sectional view for describing the manufacturing method.

Next, as illustrated in FIG. 24, the substrate 100S is removed to expose an upper surface of the insulating layer 101.

Figure 25:
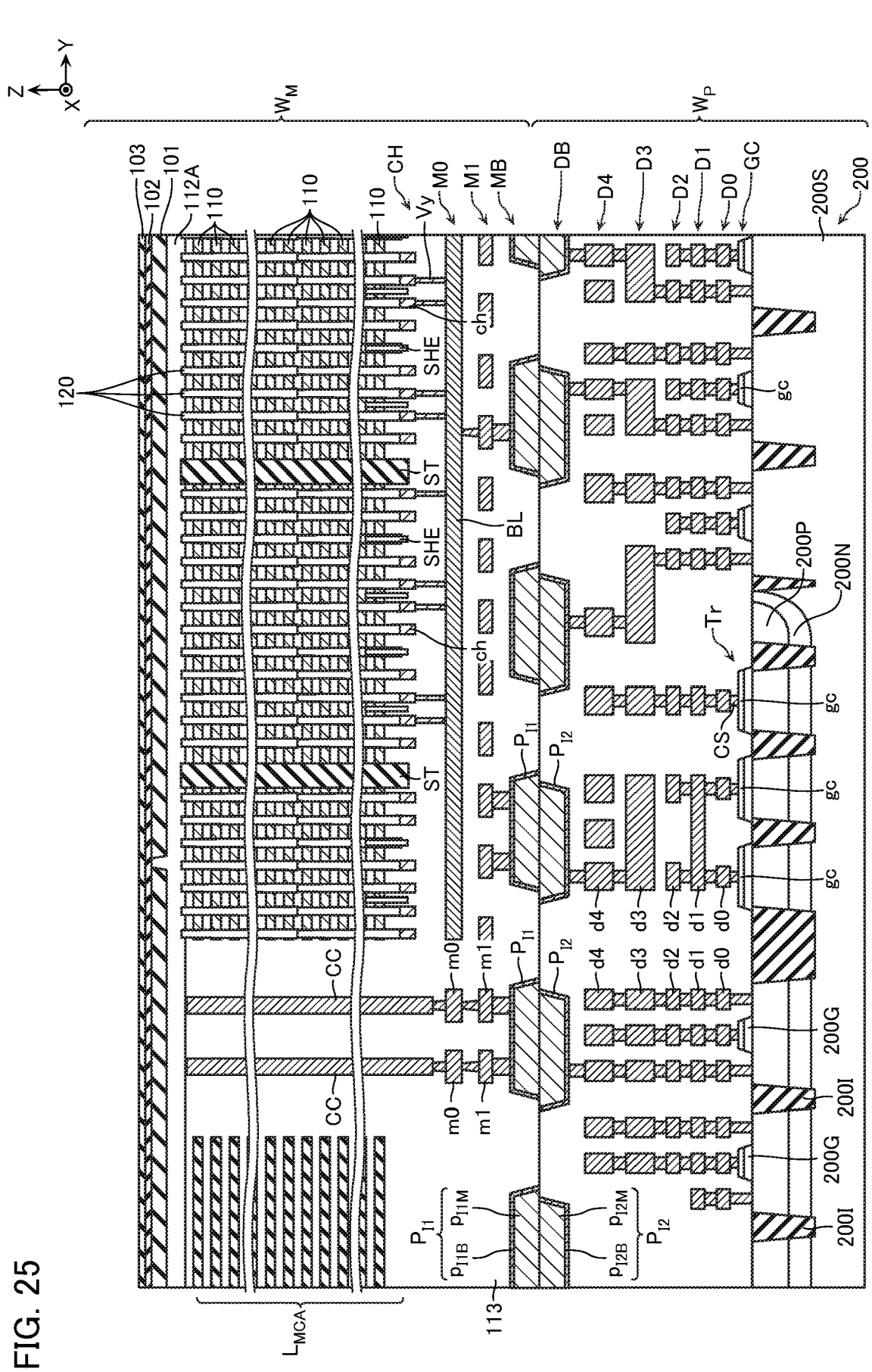
FIG. 25 is a schematic cross-sectional view for describing the manufacturing method.

Next, as illustrated in FIG. 25, the insulating layers 102, 103 are formed on the upper surface of the insulating layer 101. This process is performed by a method, such as Chemical Vapor Deposition (CVD).

Figure 26:
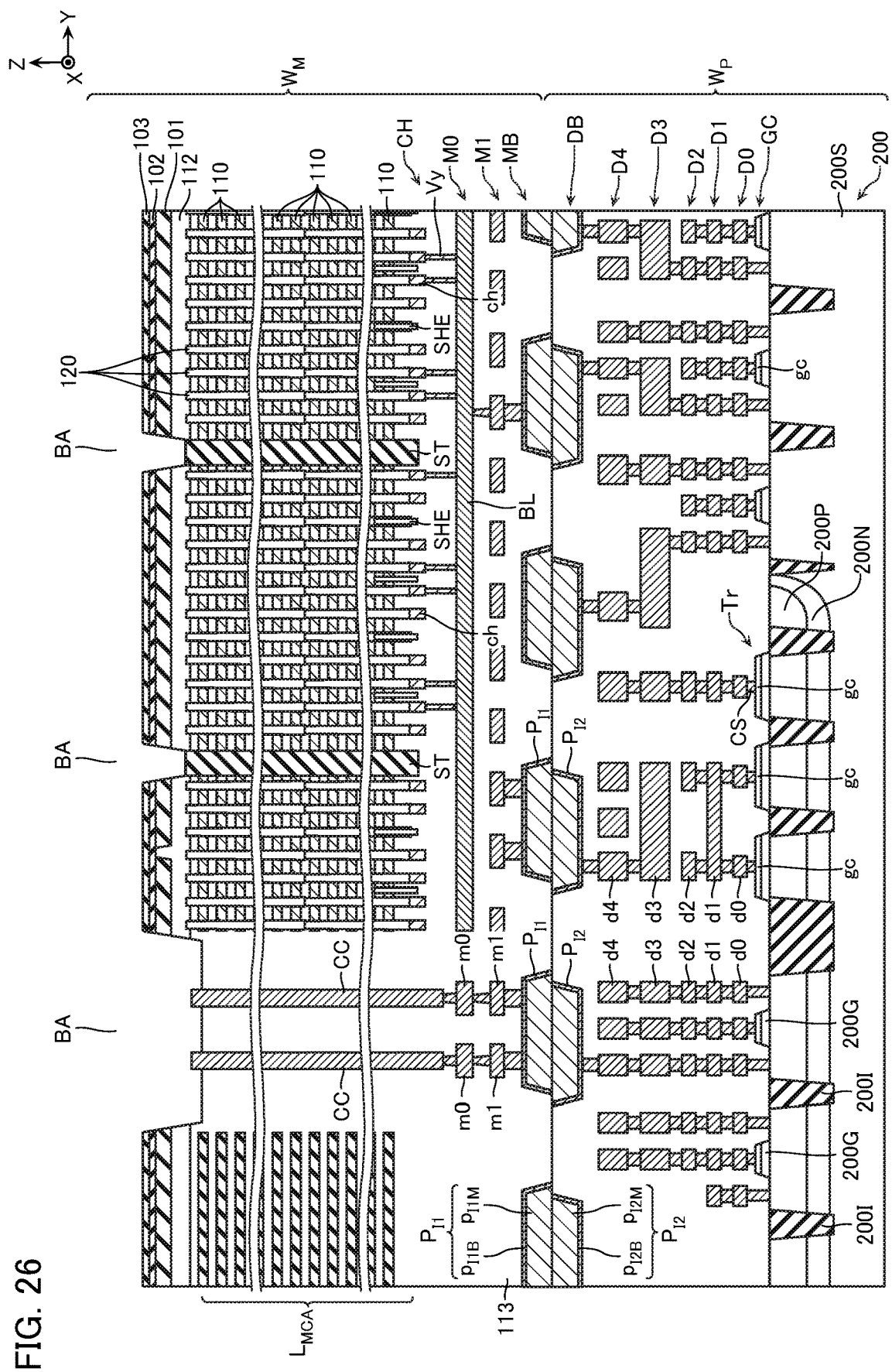
FIG. 26 is a schematic cross-sectional view for describing the manufacturing method.

Next, as illustrated in FIG. 26, the trenches BA are formed. As described above, the trench BA separates the conductive layer 112A and the insulating layers 101, 102, 103. In this process, the conductive layer 112A is separated into the plurality of conductive layers 112. In this process, the upper ends of the via-contact electrodes CC connected to the external pad electrodes $P_X$ are exposed. This process is performed by a method, such as Reactive Ion Etching (RIE).

Figure 27:
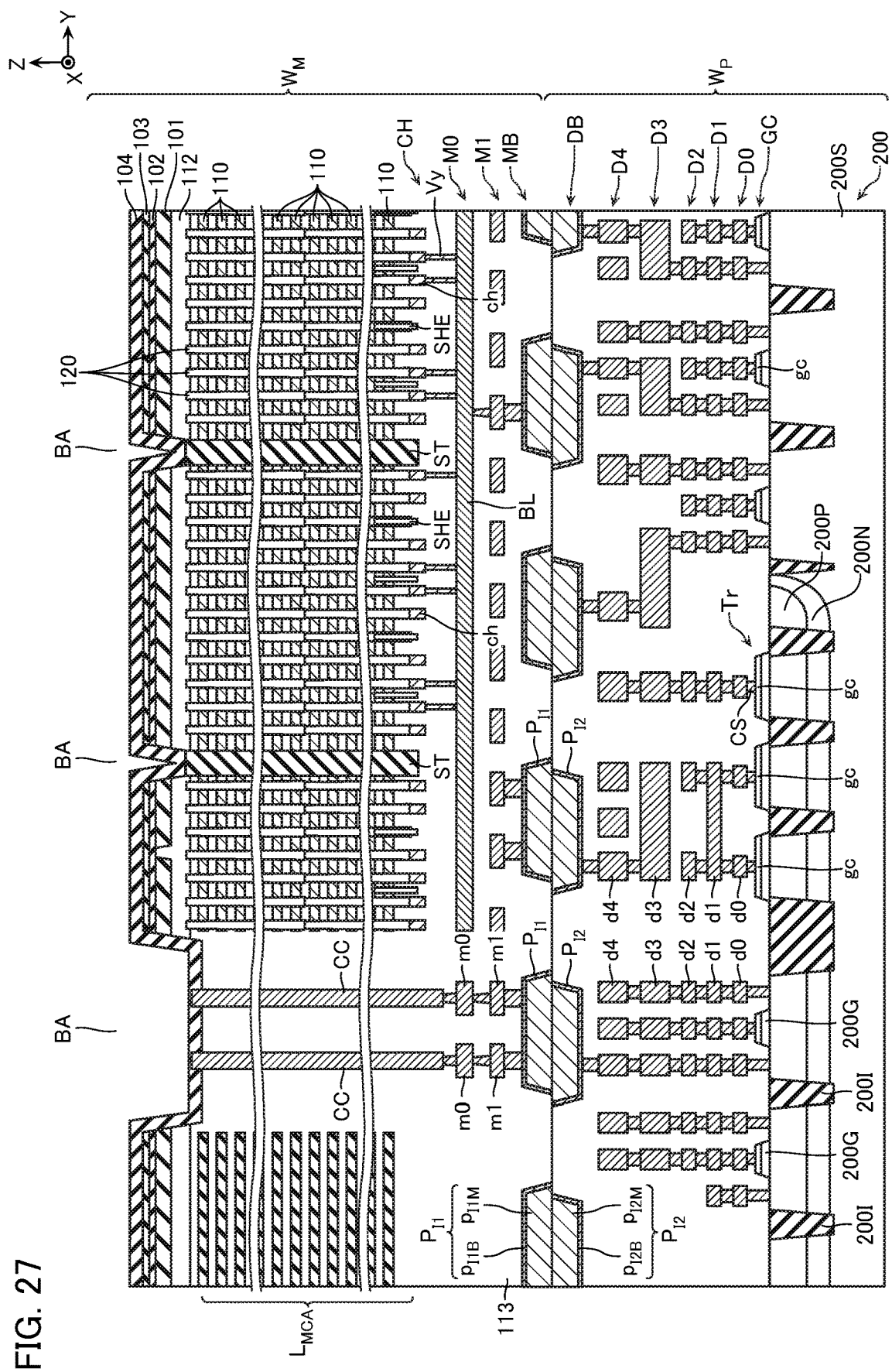
FIG. 27 is a schematic cross-sectional view for describing the manufacturing method.

Next, as illustrated in FIG. 27, the insulating layer 104 is formed on the upper surface of the insulating layer 103 and the bottom surfaces and the inner wall surfaces of the trenches BA. This process is performed by a method, such as CVD.

Figure 28:
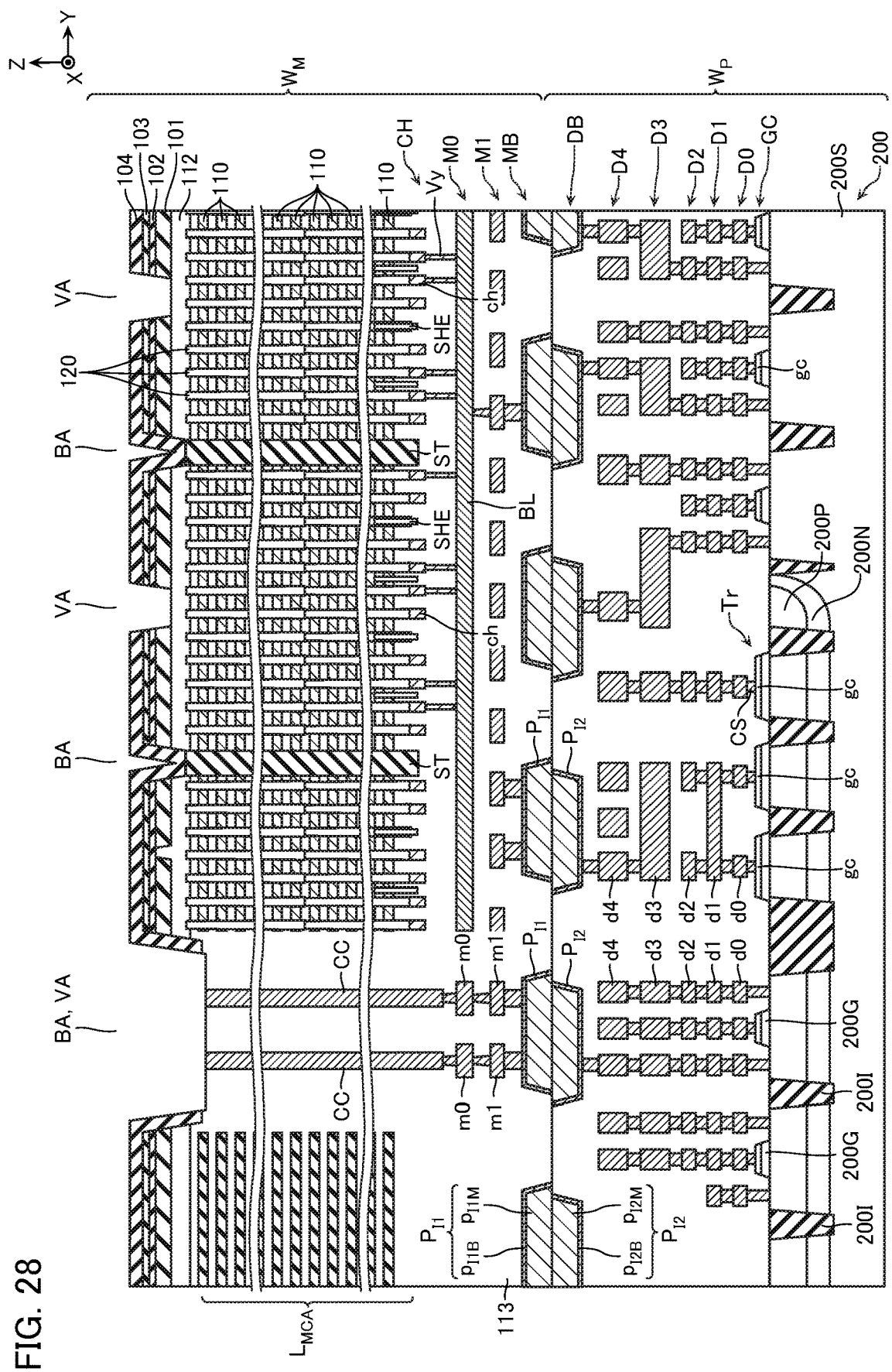
FIG. 28 is a schematic cross-sectional view for describing the manufacturing method.

Next, as illustrated in FIG. 28, the trenches VA are formed. As described above, the trench VA separates the insulating layers 101, 102, 103, 104. In this process, the upper surfaces of the plurality of conductive layers 112 and the upper ends of the via-contact electrodes CC connected to the external pad electrodes $P_X$ are exposed. This process is performed by a method, such as RIE.

Figure 29:
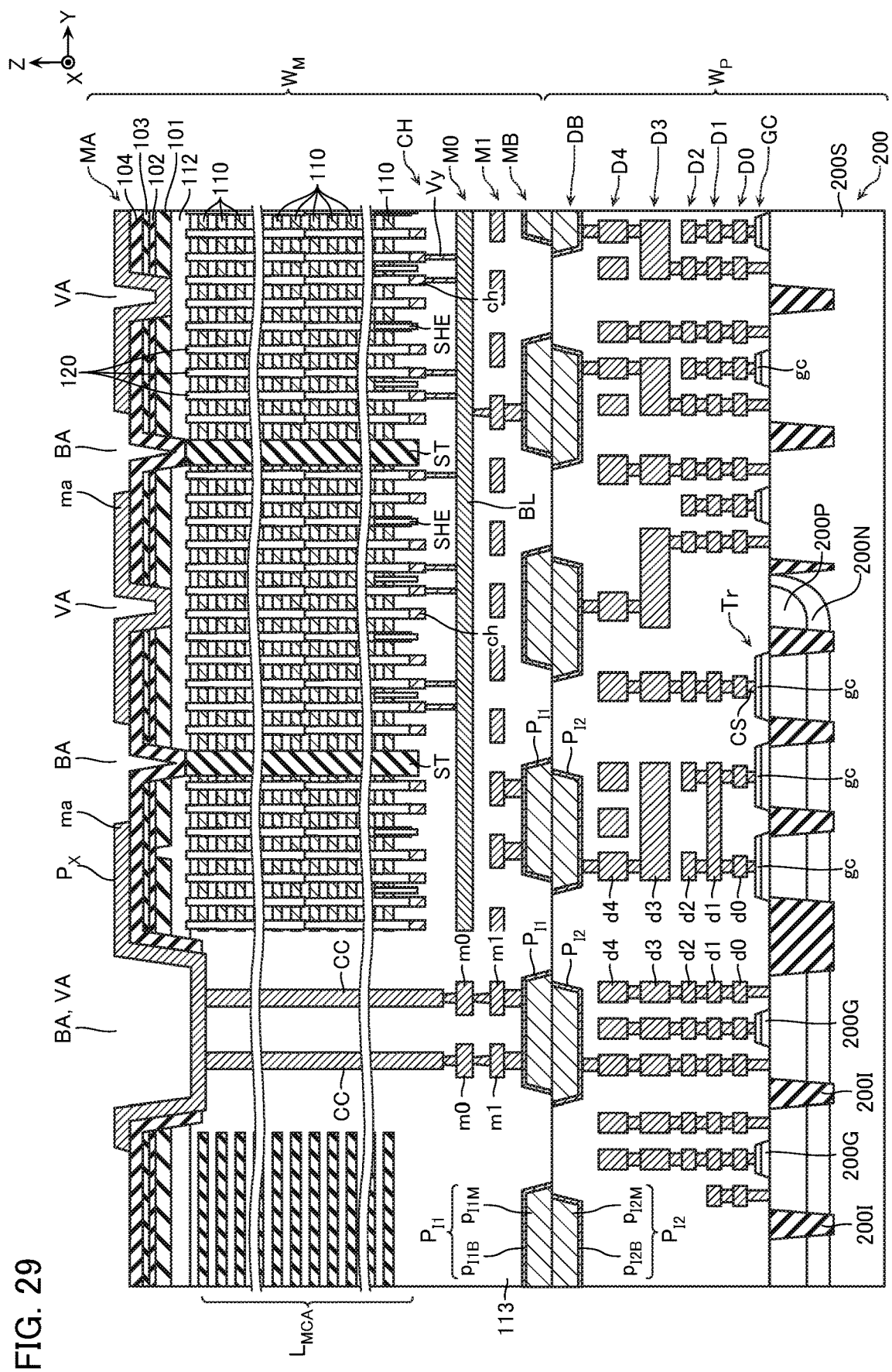
FIG. 29 is a schematic cross-sectional view for describing the manufacturing method.

Next, as illustrated in FIG. 29, the plurality of wirings ma are formed on the upper surfaces of the insulating layers 104 and the bottom surfaces and the inner wall surfaces of the trenches VA. This process is performed by a method, such as sputtering and RIE.

Figure 30:
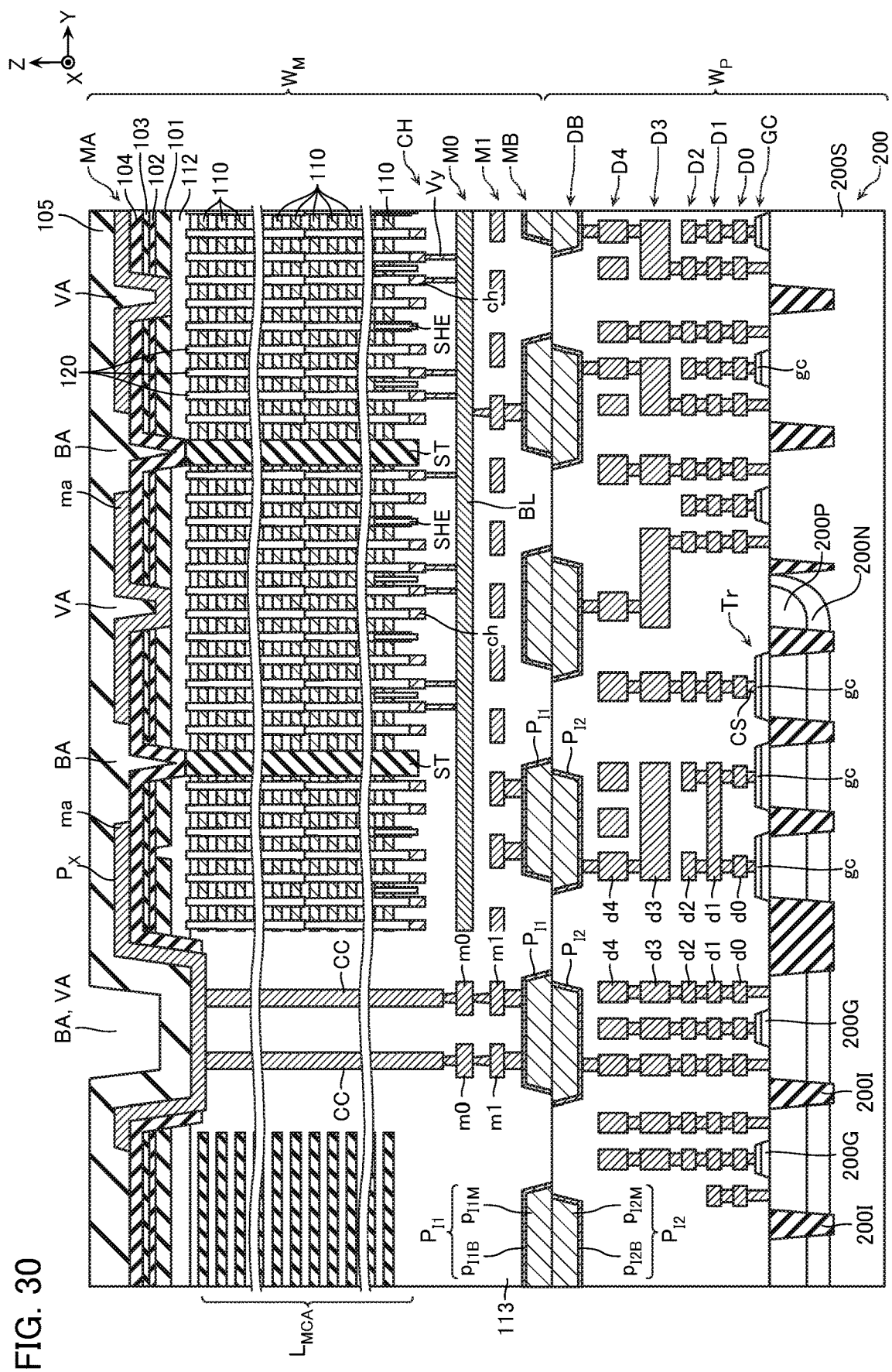
FIG. 30 is a schematic cross-sectional view for describing the manufacturing method.

Next, as illustrated in FIG. 30, the insulating layer 105 is formed on the upper surface of the insulating layer 104 and the wirings ma.

Next, as illustrated in FIG. 18, the trench TV is formed. Afterwards, dicing is performed on the bonded wafers $W_M$, $W_P$, and thus the semiconductor memory device according to the third embodiment is formed.

[Effects]

The conductive layer 112 can be separated, for example, via trench portions corresponding to the inter-memory block insulating layers ST before forming the inter-memory block insulating layers ST. However, when this method is employed, an aspect ratio of the trench portions to be processed tends to increase.

Therefore, to manufacture the semiconductor memory device according to the third embodiment, in the process described with reference to FIG. 26, the conductive layer 112A is separated into the plurality of conductive layers 112 with the trenches BA. This method can be achieved without performing a process at a high aspect ratio. Additionally, this method can be achieved without involving an increase in manufacturing process.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a plurality of memory blocks arranged in a first direction; and
   a plurality of bit lines that extend in the first direction, are arranged in a second direction intersecting with the first direction, and are arranged with the plurality of memory blocks in a third direction intersecting with the first direction and the second direction, wherein
   each of the plurality of memory blocks includes:
      a plurality of first conductive layers arranged in the third direction;
      a second conductive layer disposed on a side opposite to the plurality of bit lines in the third direction with respect to the plurality of first conductive layers;
      a plurality of semiconductor layers that extend in the third direction, are opposed to the plurality of first conductive layers, have one ends in the third direction electrically connected to the second conductive layer, and have the other ends in the third direction electrically connected to the plurality of bit lines; and
      a plurality of electric charge accumulating films disposed between the plurality of first conductive layers and the plurality of semiconductor layers,
   the plurality of first conductive layers are separated between the plurality of memory blocks, and
   the second conductive layer is separated between the plurality of memory blocks.

2. The semiconductor memory device according to claim 1, wherein
   the plurality of semiconductor layers include a plurality of first semiconductor layers arranged in the second direction, and
   the plurality of first semiconductor layers are:
      electrically connected to the common second conductive layer in the one ends in the third direction; and electrically connected to the respective different bit lines in the other ends in the third direction.

3. The semiconductor memory device according to claim 1, wherein
each of the plurality of memory blocks further includes one or a plurality of third conductive layers disposed between the plurality of first conductive layers and the second conductive layer,
a first conductive layer closest to the one or the plurality of third conductive layers among the plurality of first conductive layers is adjacent to the one third conductive layer or one of the plurality of third conductive layers closest to the plurality of first conductive layers in the third direction,
the second conductive layer is adjacent to the one third conductive layer or another of the plurality of third conductive layers closest to the second conductive layer in the third direction, and
the plurality of semiconductor layers are opposed to the one or the plurality of third conductive layers.

4. The semiconductor memory device according to claim 3, wherein
the one or the plurality of third conductive layers are separated for every memory block of the plurality of memory blocks.

5. The semiconductor memory device according to claim 3, wherein
the device is configured to perform a read operation, when the read operation is performed:
a first bit line voltage is applied to at least one of the plurality of bit lines;
in one of the plurality of memory blocks:
a read voltage is applied to one of the plurality of first conductive layers;
a read pass voltage larger than the read voltage is applied to another of the plurality of first conductive layers;
a first voltage smaller than the first bit line voltage is applied to the second conductive layer; and
a second voltage larger than the first voltage is applied to the one or the plurality of third conductive layers; and
in another of the plurality of memory blocks:
a third voltage is applied to the second conductive layer; and
a fourth voltage smaller than the third voltage is applied to the one or the plurality of third conductive layers.

6. The semiconductor memory device according to claim 5, wherein
the third voltage is larger than the first voltage.

7. The semiconductor memory device according to claim 3, wherein
the device is configured to perform a read operation, when the read operation is performed:
a first bit line voltage is applied to at least one of the plurality of bit lines;
in one of the plurality of memory blocks:
a read voltage is applied to one of the plurality of first conductive layers;
a read pass voltage larger than the read voltage is applied to another of the plurality of first conductive layers;
a first voltage smaller than the first bit line voltage is applied to the second conductive layer; and
in another of the plurality of memory blocks,
the second conductive layer is set to be in a floating state.

8. The semiconductor memory device according to claim 3, wherein
the device is configured to perform a write operation including a program operation and a verify operation, when the program operation is performed:
in one of the plurality of memory blocks:
a program voltage is applied to one of the plurality of first conductive layers;
a write pass voltage smaller than the program voltage is applied to another of the plurality of first conductive layers;
a fifth voltage is applied to the second conductive layer; and
a sixth voltage smaller than the fifth voltage is applied to the one or the plurality of third conductive layers; and
in another of the plurality of memory blocks:
the fifth voltage is applied to the second conductive layer; and
the sixth voltage is applied to the one or the plurality of third conductive layers.

9. The semiconductor memory device according to claim 8, wherein
each of the plurality of memory blocks further includes a fourth conductive layer and a fifth conductive layer disposed between the plurality of first conductive layers and the plurality of bit lines and arranged in the first direction,
a part of the plurality of semiconductor layers is opposed to the fourth conductive layer,
another part of the plurality of semiconductor layers is opposed to the fifth conductive layer, and
when the program operation is performed:
a seventh voltage is applied to the fourth conductive layer; and
an eighth voltage smaller than the seventh voltage is applied to the fifth conductive layer, and
the fifth voltage is larger than the seventh voltage.

10. The semiconductor memory device according to claim 8, wherein
when the verify operation is performed:
a second bit line voltage is applied to at least one of the plurality of bit lines;
in the one of the plurality of memory blocks:
a verify voltage is applied to the one of the plurality of first conductive layers;
a read pass voltage larger than the verify voltage is applied to the another of the plurality of first conductive layers;
a ninth voltage smaller than the second bit line voltage is applied to the second conductive layer; and
a tenth voltage larger than the ninth voltage is applied to the one or the plurality of third conductive layers; and
in the another of the plurality of memory blocks:
the fifth voltage is applied to the second conductive layer; and
the sixth voltage is applied to the one or the plurality of third conductive layers.

11. The semiconductor memory device according to claim 8, wherein
when the verify operation is performed:
a second bit line voltage is applied to at least one of the plurality of bit lines;

in the one of the plurality of memory blocks:
a verify voltage is applied to the one of the plurality of first conductive layers;
a read pass voltage larger than the verify voltage is applied to the another of the plurality of first conductive layers;
a ninth voltage smaller than the second bit line voltage is applied to the second conductive layer; and
in the another of the plurality of memory blocks, the second conductive layer is set to be in a floating state.

12. The semiconductor memory device according to claim 3, wherein
the device is configured to perform an erase operation including an erase voltage supply operation and an erase verify operation,
when the erase voltage supply operation is performed:
in one of the plurality of memory blocks:
an erase voltage is applied to the second conductive layer;
an eleventh voltage smaller than the erase voltage is applied to the one or the plurality of third conductive layers; and
a twelfth voltage smaller than the eleventh voltage is applied to at least one of the plurality of first conductive layers; and
in another of the plurality of memory blocks:
the erase voltage is applied to the second conductive layer; and
the plurality of first conductive layers and the one or the plurality of third conductive layers are set to be in a floating state.

13. The semiconductor memory device according to claim 12, wherein
when the erase verify operation is performed:
a third bit line voltage is applied to at least one of the plurality of bit lines;
in the one of the plurality of memory blocks:
an erase verify voltage is applied to the at least one of the plurality of first conductive layers;
a thirteenth voltage smaller than the third bit line voltage is applied to the second conductive layer; and
a fourteenth voltage larger than the thirteenth voltage is applied to the one or the plurality of third conductive layers; and
in the another of the plurality of memory blocks:
a fifteenth voltage is applied to the second conductive layer; and
a sixteenth voltage smaller than the fifteenth voltage is applied to the one or the plurality of third conductive layers.

14. The semiconductor memory device according to claim 12, wherein
when the erase verify operation is performed:
a third bit line voltage is applied to at least one of the plurality of bit lines;
in the one of the plurality of memory blocks:
an erase verify voltage is applied to the at least one of the plurality of first conductive layers;
a thirteenth voltage smaller than the third bit line voltage is applied to the second conductive layer; and
a fourteenth voltage larger than the thirteenth voltage is applied to the one or the plurality of third conductive layers; and
in the another of the plurality of memory blocks,
the second conductive layer is set to be in a floating state.

15. The semiconductor memory device according to claim 1, wherein
the plurality of memory blocks include a first memory block and a second memory block adjacent in the first direction,
the device further includes a first insulating layer and a second insulating layer disposed between the first memory block and the second memory block,
the plurality of first conductive layers included in the first memory block and the plurality of first conductive layers included in the second memory block are insulated via the first insulating layer, and
the second conductive layer included in the first memory block and the second conductive layer included in the second memory block are insulated via the second insulating layer.

16. The semiconductor memory device according to claim 15, wherein
a center position in the first direction of the second insulating layer is different from a center position in the first direction of the first insulating layer.

17. The semiconductor memory device according to claim 1, further comprising
a plurality of first bonding electrodes disposed on a side opposite to the plurality of memory blocks in the third direction with respect to the plurality of bit lines, wherein
a first chip including the plurality of memory blocks, the plurality of bit lines, and the plurality of first bonding electrodes is bonded to a second chip including a plurality of second bonding electrodes via the plurality of first bonding electrodes and the plurality of second bonding electrodes, and
the plurality of bit lines are disposed between the plurality of memory blocks and the second chip.

18. The semiconductor memory device according to claim 17, further comprising
a metal wiring layer disposed on a side opposite to the plurality of bit lines in the third direction with respect to the plurality of memory blocks, wherein
the metal wiring layer includes a plurality of metal wirings respectively connected to a plurality of second conductive layers corresponding to the plurality of memory blocks.

19. A semiconductor memory device comprising:
a plurality of memory blocks arranged in a first direction; and
a plurality of bit lines that extend in the first direction, are arranged in a second direction intersecting with the first direction, and are arranged with the plurality of memory blocks in a third direction intersecting with the first direction and the second direction, wherein
each of the plurality of memory blocks includes:
a plurality of first conductive layers arranged in the third direction;
a second conductive layer disposed on a side opposite to the plurality of bit lines in the third direction with respect to the plurality of first conductive layers;
a plurality of semiconductor layers that extend in the third direction, are opposed to the plurality of first conductive layers, have one ends in the third direction electrically connected to the second conductive layer, and have the other ends in the third direction electrically connected to the plurality of bit lines; and a plurality of electric charge accumulating films disposed between the plurality of first conductive layers and the plurality of semiconductor layers, wherein the second conductive layer is separated between the plurality of memory blocks, the device is configured to perform a read operation, a write operation including a program operation and a verify operation, and an erase operation including an erase voltage supply operation and an erase verify operation, and when at least one of the read operation, the verify operation, or the erase verify operation is performed:
- a bit line voltage is applied to at least one of the plurality of bit lines;
- a voltage different from the bit line voltage is applied to the second conductive layer in one of the plurality of memory blocks; and
- the second conductive layer in another of the plurality of memory blocks is set to be in a floating state.

20. The semiconductor memory device according to claim 19, wherein the plurality of semiconductor layers include a plurality of first semiconductor layers arranged in the second direction, and the plurality of first semiconductor layers are:
- electrically connected to the common second conductive layer at a side of the one ends in the third direction; and
- electrically connected to the respective different bit lines at a side of the other ends in the third direction.

* * * * *